United States Patent [19]

Kuwagata et al.

[11] Patent Number: 5,544,120

[45] Date of Patent: Aug. 6, 1996

[54] SEMICONDUCTOR INTEGRATED CIRCUIT INCLUDING RING OSCILLATOR OF LOW CURRENT CONSUMPTION

[75] Inventors: Masaaki Kuwagata, Kawaguchi; Ryosuke Matsuo, Yokohama; Keiji Maruyama, Kawasaki; Naokazu Miyawaki, Yokohama; Hisashi Ueno, Oita, all of Japan

[73] Assignee: Kabushiki Kaisha Toshiba, Tokyo, Japan

[21] Appl. No.: 224,905

[22] Filed: Apr. 7, 1994

[30] Foreign Application Priority Data

Apr. 7, 1993 [JP] Japan .................................. 5-080863

[51] Int. Cl.$^6$ ........................... G11C 11/406; H03B 5/00
[52] U.S. Cl. ............................ 365/222; 331/57; 331/66;
331/175; 331/176; 331/186; 365/227
[58] Field of Search ................................ 331/57, 66, 175,
331/176, 186; 365/222, 227

[56] References Cited

U.S. PATENT DOCUMENTS 4,853,654  8/1989  Sakurai ....................... 331/176 X
4,939,695  7/1990  Isobe et al. ....................... 365/222

Primary Examiner—Siegfried H. Grimm
Attorney, Agent, or Firm—Loeb & Loeb LLP

[57] ABSTRACT

A semiconductor integrated circuit includes a bias voltage regulation circuit having variable resistors which are provided between voltage output circuits of higher and lower potential sides and changes corresponding to a specified condition such as $V_{CC}$ and a temperature. The variable resistors and bias voltage output circuits form a $V_{CC}$ divider, and the variable resistors properly regulate a bias voltage supplied to an oscillation circuit corresponding to each of the specified conditions. Accordingly, if the oscillation circuit is used in an automatic refresh circuit of a PSRAM, an increase of a refresh operation frequency is suppressed regardless of an increase in $V_{CC}$. Since a temperature depending variable resistor causes a resistance value to be reduced by the predetermined characteristics against the temperature increase, it is possible to set an oscillation frequency to provide a desired pause for guarantee of circuit operation. It is possible to provide a ring oscillator having a low dependency of the oscillation frequency on a power source voltage and a temperature characteristic, thereby decreasing its current consumption.

17 Claims, 18 Drawing Sheets

FIG. 21A
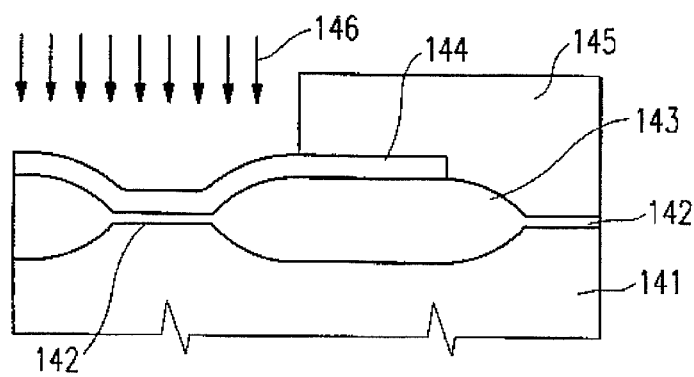
FIG. 21B
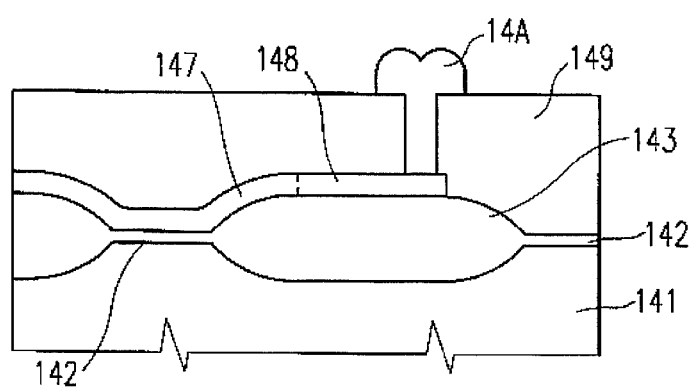
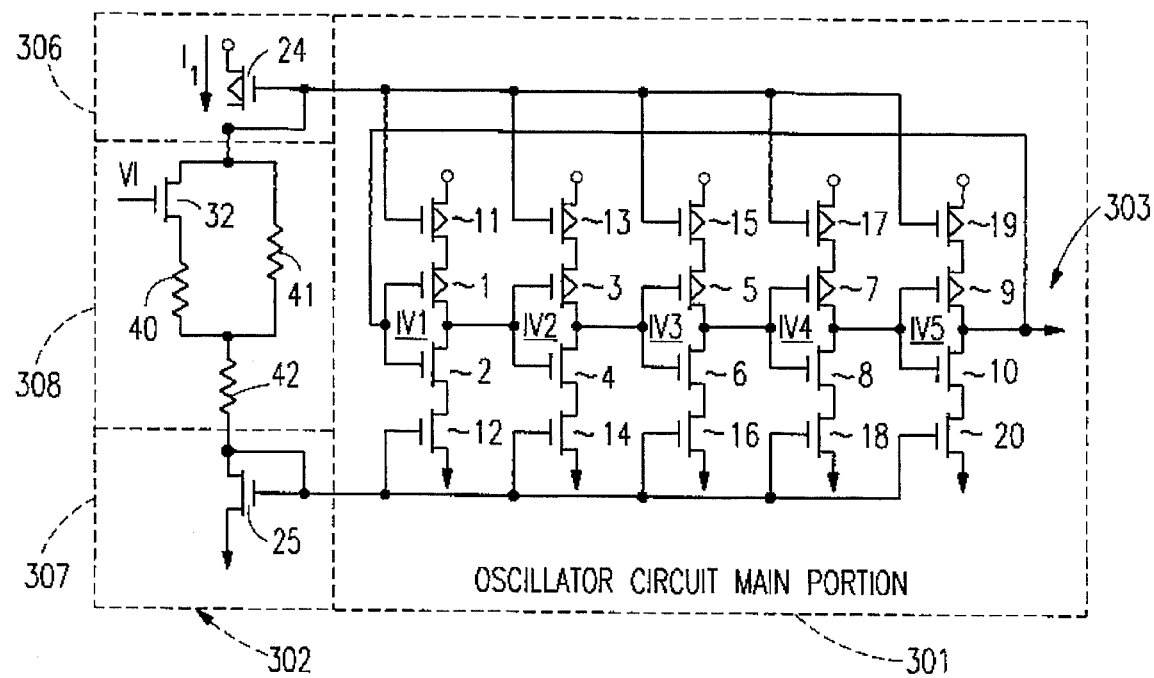
FIG. 22

SEMICONDUCTOR INTEGRATED CIRCUIT INCLUDING RING OSCILLATOR OF LOW CURRENT CONSUMPTION

BACKGROUND OF THE INVENTION

The present invention relates to a semiconductor integrated circuit including a ring oscillator circuit constituted from an odd number of inverter stages connected to one another so that an input of the first stage is connected to an output of the final stage to form a ring.

A ring oscillator circuit having an odd number of inverter stages connected to form a ring is a well-known circuit which uses repeated charge and discharge operations. Repeated charge and discharge operations occur because the levels of input and output nodes of the inverter circuits are not stable (i.e., do not have a constant level) due to the odd number of inverter stages. A signal having a predetermined frequency is obtained through the repeated charge and discharge operations. At high oscillating frequencies, such a ring oscillator circuit undergoes a higher number of charge and discharge operations per unit time, so that the high frequency ring oscillator circuit has a large current consumption. To suppress power consumption, it is necessary that an oscillating frequency of the ring oscillator not be higher than is necessary.

In this connection, the problem of high current consumption has been highlighted due to the popularity of portable electronic devices and other apparatus operated by battery. It is desirable for batteries to last longer.

FIG. 1 shows an example of a conventional ring oscillator circuit including an element for reducing current consumption. In FIG. 1, numeral 101 denotes an oscillator circuit main portion having inverter circuits $IV_1$–$IV_5$ in which the inverter stages are connected by a cascade connection and in which an input of the first stage inverter circuit $IV_1$ is connected to an output of the fifth inverter circuit $IV_5$ to form the ring oscillator circuit 103 having five stages. Each of the inverter circuits $IV_1$–$IV_5$ is a complementary metal oxide layer semiconductor (CMOS) circuit. Numeral 1 denotes a P channel type MOS (hereafter called as PMOS) transistor within inverter circuit $IV_1$, 2 denotes an N channel type MOS (hereafter called as NMOS) transistor within the same inverter; 3 denotes a PMOS transistor constituting the inverter circuit $IV_2$, 4 denotes an NMOS transistor constituting the same; 5 denotes a PMOS transistor constituting the inverter circuit $IV_3$, 6 denotes an NMOS transistor constituting the same; 7 denotes a PMOS transistor constituting the inverter circuit $IV_4$, 8 denotes an NMOS transistor constituting the same; and 9 denotes a PMOS transistor constituting the inverter circuit $IV_5$, and 10 denotes an NMOS transistor constituting the same.

The oscillator circuit main portion 101 includes bias circuit 104 for biasing each of the transistors 1–10 of the inverter circuits $IV_1$–$IV_5$, and the bias circuit 104 comprises the PMOS transistors 11, 13, 15, 17 and 19 and the NMOS transistors 12, 14, 16, 18, and 20. The PMOS transistor 11 is connected between the PMOS transistor 1 and a power source potential $V_{CC}$ for biasing the transistor 1, and the NMOS transistor 12 is connected between the NMOS transistor 2 and a grounded potential for biasing the transistor 2. In the same manner, the bias transistors 13–20 are provided for biasing the inverter transistors 3–10.

Numeral 102 denotes a bias control circuit; bias control circuit 102 comprises a PMOS transistor 21, an NMOS transistor 22 and a passive resistor element 23. The source and drain of PMOS transistor 21 are connected between the power source potential $V_{CC}$ and a terminal on the higher potential side of the passive resistor element. The drain and gate of PMOS transistor 21 are shorted to each other and are connected to the gates of PMOS transistors 11, 13, 15, 17 and 19. The source and drain of the NMOS transistor 22 are connected between the ground potential and a terminal on the lower potential side of resistor 23. The drain and gate of NMOS transistor 22 are shorted to each other and are connected to the gates of NMOS transistors 12, 14, 16, 18 and 20.

The circuit having the above construction operates as follows. An "L" (a low level) signal is provided to an input terminal (at node nd1) of the inverter circuit $IV_1$. Then, a node nd2 at a junction point between an output terminal of the inverter $IV_1$ and an input terminal of the inverter $IV_2$ rises to an "H" (a high level), and causes node nd3 at a junction point between an output terminal of the inverter $IV_2$ and an input terminal of the inverter $IV_3$ falls to an "L" level. In the same manner, node nd4 rises to "H", and node nd5 falls to an "L" level.

One cycle consists of the chain of operations starting with the signal on the node nd1 and ending with the signal on node nd5. In a next cycle, the node nd1 will change to a level "H", opposite to the level at node nd1 in the previous cycle. Consequently, the other nodes nd2–nd5 will invert to the opposite level as the next cycle progresses. As such cycles are repeated, it is possible for each of the nodes nd1–nd5 to generate a signal having a predetermined frequency decided by a charge and discharge time for each of the nodes nd1–nd5.

The potential at output nodes nd21 and nd22 at the gates of PMOS transistor 21 and NMOS transistor 22 is inversely proportional to a size of the resistor element 23. Accordingly, the potentials at nodes nd21 and nd22 can be reduced to near the threshold values $V_{tp}$ and $V_{tn}$ of transistors 21 and 22. In other words, the potential at nodes nd21 and nd22 is as follows:

$$V_{21}=V_{CC}-V_{tp} \tag{1}$$

$$V_{22}=V_{tn} \tag{2}$$

The voltage $V_{GS}$ between the gate and source of transistors 1–10 in the oscillator circuit main portion 101 is determined by the voltages output by the bias control circuit 102. In short, $V_{GS}$ of the PMOS transistors 1, 3, 5, 7 or 9 is:

$$V_{GS}=V_{tp} \tag{3}$$

and $V_{GS}$ of the NMOS transistors 2, 4, 6, 8 or 10 is:

$$V_{GS}=V_{tn} \tag{4}$$

Here, the $V_{GS}$ provided limits the current through transistors 1–10. Since the current of the transistors 1–10 is suppressed to a minimum value when the $V_{GS}$ is suppressed near $V_{tp}$ and $V_{tn}$ at the respective transistors, the circuit illustrated in FIG. 1 can be used to decrease current consumption.

However, in the ring oscillation circuit 101, $V_{GS}$ of the transistors 11 and 20 increases with increasing power source voltage, so that an oscillation frequency increases as shown by line F in the graph of FIG. 2A. Furthermore, there is a problem that the current consumption increases in proportion to the power source voltage.

Still furthermore, an increase in the oscillation frequency can increase the current consumption of other circuitry associated with the ring oscillator circuit. An example is when the ring oscillator circuit is used in a self-refresh circuit for a pseudo static random access memory (PSRAM). After the self-refresh circuit divides a frequency of an output of the ring oscillator circuit and transforms the frequency into a desired frequency, the self-refresh circuit performs a refresh operation at a cycle determined by the desired frequency. Even though current is ordinarily consumed during refresh operation, if the oscillation frequency of the ring oscillator is raised, the cycle for refresh operations is shortened, thereby increasing a current consumption.

Moreover, it is desired that a pause characteristic of the semiconductor memory cell requiring the refresh operation be improved in a low temperature environment. As shown by line $T_2$ in the graph of FIG. 2B, the lower the temperature of the environment is, the smaller the refresh number needs to be. In other words, at higher environment temperatures, it is necessary to increase the refresh number per unit time by shortening the cycle of the refresh operation. The refresh cycle is generally set by matching the pause characteristic in such a manner that accurate refresh operation can be performed under the worst temperature environment (the highest temperature environment) within a temperature range for guaranteeing circuit operation. Consequently, since the number of refresh operations is much greater than necessary per unit time with decreasing temperature, this manner of setting the refresh condition results in increased current consumption.

SUMMARY OF THE INVENTION

A first object of the present invention is to provide a semiconductor integrated circuit capable of forming a ring oscillator which can decrease a current consumption.

A second object of the present invention is to provide a semiconductor integrated circuit capable of forming a ring oscillator in which a variation of the oscillation frequency with the power source voltage is smaller than the conventional circuit.

A third object of the present invention is to provide a semiconductor integrated circuit capable of forming a ring oscillator for oscillating at a frequency having a temperature dependence.

To achieve the above objects, a semiconductor integrated circuit has a ring oscillator circuit including an odd number of CMOS inverter circuits, a higher potential side bias circuit for biasing higher side transistors of the CMOS inverter circuits, a lower potential side bias circuit for biasing lower side transistors of the CMOS inverter circuits, a higher potential side bias voltage supply circuit for supplying a bias voltage to the higher potential side bias circuit, a lower potential side bias voltage supply circuit for supplying a bias voltage to the lower potential side bias circuit, and a bias voltage regulation circuit including a variable resistor circuit which changes corresponding to a specified condition. The bias voltage regulation circuit is provided between the higher potential side voltage supply circuit and the lower potential side voltage supply circuit so as to form a voltage divider therewith. The bias voltage regulation circuit changes an output voltage of the higher potential side bias voltage supply circuit and the lower potential side bias voltage supply circuit by changing a resistance value of the variable resistor circuit.

The specified condition is, for example, set by a power source voltage.

In this case, the bias voltage regulation circuit can be realized by a power source depending variable resistor circuit including b, variable control transistor having a source and drain connected to the intermediate node of a passive resistor and having a variable resistance value between the source and drain thereof determined by a conductive condition, and a control voltage generation circuit for controlling a gate potential for the variable control transistor so that the voltage between the gate and source of the variable control transistor increases with increases in the power source voltage.

Furthermore, the power source depending variable resistor circuit can include a plurality of passive resistor elements connected in series with one another and a variable control transistor having a drain connected to one end of a passive resistor element and a source connected to the other end of the passive resistor element.

Still furthermore, the power source depending variable resistor circuit may include a plurality of passive resistor elements connected in series with one another, and a variable control transistor having a drain-source current flow path connected between a first and second resistor element of the plurality of passive resistor elements.

On the other hand, the control voltage generation circuit can be constituted by a plurality of voltage dividing control transistors having current paths connected in series with each other between a higher potential and a lower potential, and an intermediate potential generation circuit for controlling a gate potential of the variable control transistor in accordance with an intermediate potential which is generated from an interconnection point of the current paths of the plurality of voltage dividing control transistors.

On the other hand, a temperature may be used to set the specified condition.

In this case, for example, the bias voltage regulation circuit comprises a temperature depending variable resistor circuit constituted from a combination of a plurality of passive resistor elements having different temperature characteristics.

The temperature depending variable resistor circuit can be realized by a temperature independent variable resistor element for keeping a predetermined resistance value independent of a temperature change, and a temperature depending variable resistor element connected in parallel with the temperature independent variable element which has a negative characteristic with respect to temperature change.

Alternatively, the temperature depending variable resistor circuit can be realized by a temperature independent variable resistor element for keeping a predetermined resistance value independent of a temperature change, and a temperature depending variable resistor element connected in series with the temperature independent variable element and having a negative characteristic with respect to temperature change.

Furthermore, the temperature depending variable resistor circuit can be also realized by a temperature independent variable resistor element for keeping a predetermined resistance value independent of temperature change, and a first temperature depending variable resistor element connected in parallel with the temperature variable resistor element and having a predetermined negative characteristic with respect to a temperature change, and a second temperature depending variable resistor element connected in series with the temperature independent resistor element and having a negative characteristic with respect to temperature change.

Both a power source voltage and a temperature can be used to set the specified condition. When various kinds of the above configurations are combined with each other or one another, it is possible to realize a variable resistor circuit having a dependency on both a power source voltage and a temperature condition.

It is possible to form a pseudo static random access memory (PSRAM) when dynamic type memory cells and a refresh function portion for refreshing the memory cells at a cycle on the basis of an output frequency of a ring oscillation circuit are provided in addition to the above configuration.

By the semiconductor integrated circuit according to the present invention, since a voltage divider of the power source voltage is formed from the bias voltage output circuits on the higher and lower potential sides and the variable resistor circuit varies in response to the specified conditions such as the power source voltage and temperature, it is possible to properly regulate a bias voltage to the ring oscillation circuit according to a change of the resistance value of the variable resistor circuit to minimize current consumption for the above conditions.

Furthermore, in the case where the ring circuit of the present invention is used as a self-refresh circuit for a PSRAM, a refresh cycle may be unnecessarily short for higher power source voltages. It is possible to prevent unnecessary refresh operations, thereby suppressing an increase of current consumption from unnecessary refresh operations.

In other words, if a temperature change causes the temperature depending variable resistor circuit to increase its resistance in response to an increase of the power voltage as the specific characteristic, the bias voltage output circuit and the ring oscillation circuit suppress an increase of the current flow as compared to the prior art, even though the power source voltage increases. Because the ring oscillation circuit suppresses an increase in current flow, the ring oscillation circuit can reduce the change of the potential difference between a gate and a source of transistors within the ring oscillation circuit. This manner of operation suppresses an increase of the oscillation frequency of the ring oscillation circuit. Therefore, it is possible to provide a ring oscillation circuit for keeping the oscillation frequency being more stable than the prior art against the change of the power source voltage.

Furthermore, when the temperature depending variable resistance circuit changes its resistance value in response to an increase in temperature, it is possible to provide a ring oscillation circuit for changing an oscillation frequency corresponding to a temperature. In the case where the ring oscillation circuit is used in the self-refresh circuit for the PSRAM, it is possible to change the refresh cycle (i.e., the worst pause characteristic) according to a temperature. The refresh cycle is made shorter for higher temperatures. Alternatively, the lower the temperature, the longer the refresh cycle. The circuit of the prior art wastes current in a low temperature condition because the oscillation frequency of the ring oscillation circuit is set for matching the refresh cycle under the worst condition (the highest temperature condition) to ensure circuit operation of the PSRAM. When the present ring oscillation circuit is used in a PSRAM, the oscillation frequency of the ring oscillation circuit is set to the minimum refresh cycle which ensures circuit operation of the PSRAM.

As described above, it is possible for a semiconductor integrated circuit to provide a ring oscillator having a low dependency of the oscillation frequency on the power source voltage or temperature. Such a semiconductor integrated circuit can properly regulate a bias voltage supplied to the ring oscillation circuit by changing the resistance value of the variable resistor circuit to correspond to the specified condition such as the power voltage and a temperature. The ring oscillation circuit includes a divider for dividing bias voltage provided on the lower and higher potential sides and a variable resistor circuit for changing a resistance value corresponding to the specified condition.

Further describing current consumption, since the resistance value of the variable resistor circuit increases in the predetermined manner for an increase in the power source voltage, the current flow does not increase in the bias voltage output circuit and the ring oscillation circuit, even though the power source voltage increases. Thus, the operation condition of transistors within the ring oscillation circuit remains near the threshold value, thereby suppressing an increase of the oscillation frequency of the ring oscillation circuit.

When the conventional ring oscillation circuit is used in the self-refresh circuit of the PSRAM, the refresh cycle becomes unnecessarily short according to the power source voltage. It is possible to prevent an unnecessary increase of the number of the refresh operation per unit time, thereby suppressing an increase of the consumed current.

When the resistance value of the temperature depending variable resistor circuit changes by the predetermined characteristic with an increase in temperature, it is possible to provide a ring oscillation circuit for changing an oscillation frequency corresponding to a temperature. In the case where the ring oscillation circuit is used in the self-refresh circuit for the PSRAM, it is possible to change the refresh cycle (the worst pause characteristic) according to temperature. In short, the higher the temperature is, the shorter the refresh cycle. Alternatively, the lower the temperature is, the longer the refresh cycle. The circuit of the prior art wastes current in a low temperature condition because the oscillation frequency of the ring oscillation circuit is set for matching the refresh cycle under the worst condition (the highest temperature condition) to ensure circuit operation of the PSRAM. When the present ring oscillation circuit is used in a PSRAM, the oscillation frequency of the ring oscillation circuit is set to the minimum refresh cycle which ensures circuit operation of the PSRAM.

BRIEF DESCRIPTION OF THE DRAWINGS

In the accompanying drawings:

FIGS. 21A and 21B are sectional views of devices showing a method of manufacturing a high resistance (R) resistor as an example of temperature depending passive resistance elements;

FIG. 22 is a circuit diagram showing a seventh embodiment of a variable resistor having both dependencies of a temperature and power source voltage ($V_{CC}$);

DETAILED DESCRIPTION OF THE PREFERRED EMBODIMENTS

There will be described in detail a semiconductor integrated circuit according to preferred embodiments of the present invention with reference to the attached drawings.

Figure 3:
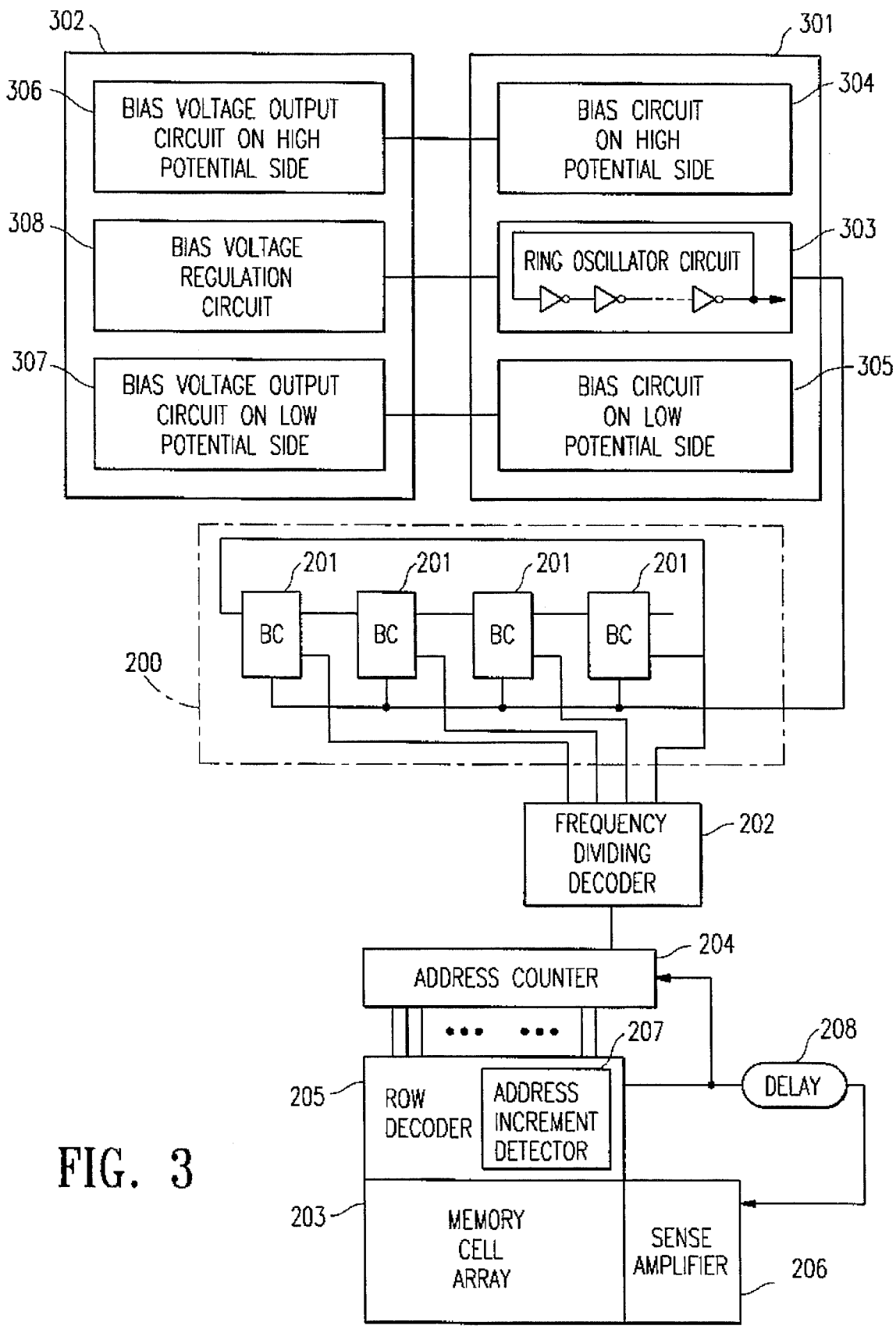
FIG. 3 is a block diagram showing an application in which a basic configuration of a ring oscillation circuit according to a first embodiment of the present invention is used within a PSRAM circuit.

FIG. 3 shows a basic configuration according to an embodiment of the present invention used in a PSRAM.

Figure 1:
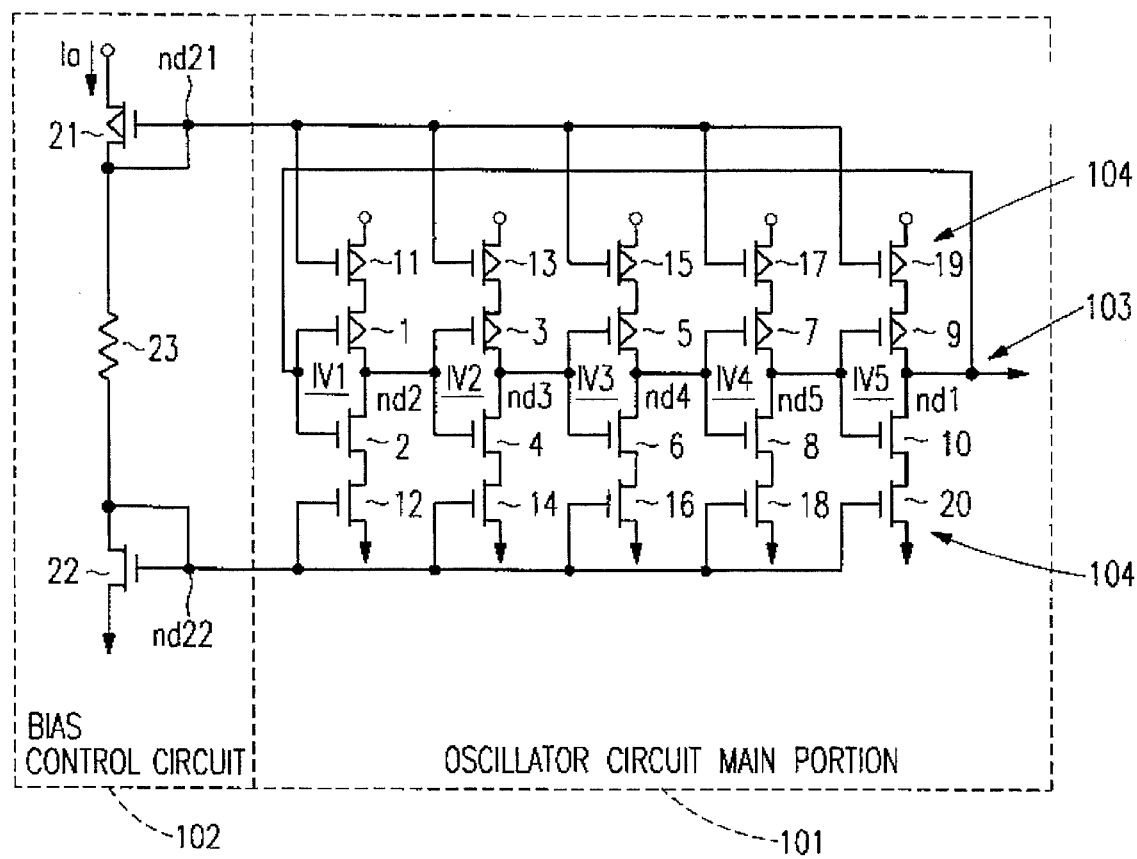
FIG. 1 is a circuit diagram showing a configuration of the conventional ring oscillation circuit.
Figure 2A:
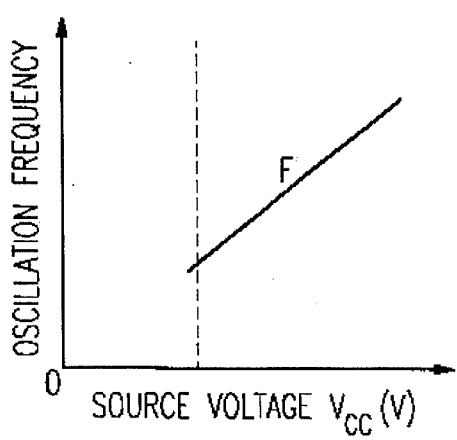
FIGS. 2A and 2B are characteristic diagrams respectively showing problems, one of which is the circuit shown in FIG. 1 against a power source voltage ($V_{CC}$), the other of which is the circuit shown in FIG. 1 against a temperature.
Figure 2B:
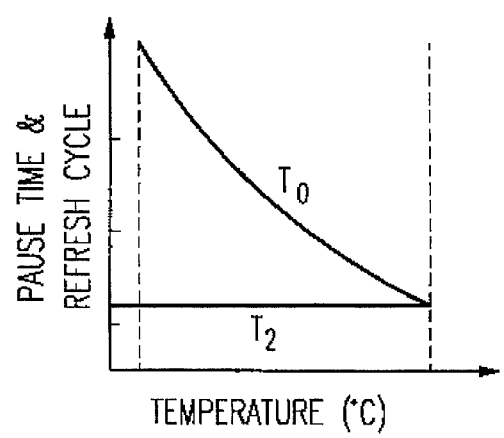

In FIG. 3, numeral 301 denotes an oscillation circuit main portion which has substantially the same circuitry as the oscillation circuit main portion 101 shown in FIG. 1, and the main portion 301 comprises a ring oscillation circuit 303 including complementary metal-oxide semiconductor (CMOS) inverter circuits having an odd number of stages, a higher potential side bias circuit 304 for biasing the higher potential side transistors in the CMOS inverter circuits, and a lower potential side bias circuit 305 for biasing the lower potential side transistors of the CMOS inverter circuit.

Numeral 302 denotes a bias control circuit for controlling bias voltages of the bias circuits 304 and 305, which has the same general configuration as the control circuit 102 shown in FIG. 1, and comprises a bias voltage output circuit 306 on a higher potential side, a bias voltage output circuit 307 on a lower potential side, and a bias voltage regulation circuit 308. The bias voltage output circuits 306 and 307 are provided for outputting bias voltages to the higher and lower potential sides bias circuits 304 and 305, respectively.

The bias voltage regulation circuit 308 comprises a variable resistance circuit which changes a resistance value corresponding to a change in a power source voltage $V_{CC}$ or a temperature, mentioned later, and is arranged between the bias voltage output circuits 306 and 307 to form a voltage divider for dividing a power source voltage $V_{CC}$, so that a change of the resistance value of circuit 308 can change the voltages output by both of the bias voltage output circuits 306 and 307.

By the above-mentioned constitution, the variable resistor of the bias voltage regulation circuit 308 regulates the bias voltages on both the higher and lower potential sides corresponding to the power source voltage $V_{CC}$ and/or a temperature. By this, it is possible to suppress the increase of the oscillation frequency caused by variations in the power source voltage $V_{CC}$.

Numeral 200 denotes a counter circuit comprised of a plurality (e.g., four) of binary counters 201, and numeral 202 denotes a frequency dividing decoder, which together function as a frequency divider for an output of the ring oscillation circuit 303. In other words, the output of the ring oscillation circuit 303 is supplied as driving pulses to each of the binary counters 201, and an output of each of the binary counters 201 is supplied as outputs of the counter circuit 200 to the frequency dividing decoder 202. The frequency dividing decoder 202 outputs one pulse when the output value of the counter circuit 200 reaches a set value. Accordingly, since one pulse is outputted from the frequency dividing decoder 202 after the ring oscillation circuit 303 outputs a plurality of pulses equal to a set value, an output of the ring oscillation circuit 303 is divided.

Numeral 203 denotes a memory cell array, 204 denotes an address counter, 205 denotes a row decoder, and 206 denotes a sense amplifier, all of which constitute a PSRAM circuit including a refresh function.

The address counter 204 starts and performs an increment operation in cooperation with the row decoder 205 each time the frequency dividing decoder 202 outputs a pulse, that is, when the ring oscillation circuit 301 outputs the set number of pulses. Address counter 204 increases at first by means of a pulse supplied by the frequency dividing decoder 202, and then performs a counting operation using pulses supplied by an address increment detector 207 within row decoder 205, described in detail later. An output of the address counter 204 is provided to a buffer within the row decoder 205. When an address value in the buffer is increased, a pulse is supplied to the address counter 204, a counted value in the address counter 204 is increased to increment the row address, and an increased address value is stored in the buffer by renewal of the buffer content in the row decoder 205 and a detection of the detector 207.

Word lines of the memory cell array 203 are raised to select a line of memory cells corresponding to an address stored in the buffer of the row decoder 205. An output pulse of the address increment detector 207 sequentially raises the word lines for each address as the address is taken into the buffer of the row decoder 205 during the increment operation. The output pulse is outputted as an enable signal through a delay line 208 to the sense amplifier 206. Accordingly, after the raise of the word lines, the sense amplifier 206 is activated with a delay for the delay time. This operation is performed with respect to each cell for each row address of the increment operation, thereby performing a refresh operation with respect to all of the cells.

As clearly understood from the above description, a refresh cycle of cells corresponds to a cycle divided from an output clock pulse of the ring oscillation circuit 303, which is determined by the oscillation frequency of the ring oscillation circuit 303. The oscillation frequency of the ring oscillation circuit 303 is properly regulated corresponding to the power source voltage $V_{CC}$ and the temperature by means of the bias voltage regulation circuit 308.

Accordingly, even though the oscillation frequency of the ring oscillation circuit conventionally becomes higher with an increase of the power source voltage $V_{CC}$ so as to increase current consumption, the present invention can suppress an increase in current consumption caused by such a reason.

A pause characteristic of a memory cell such as a PSRAM necessary to the refresh operation has a temperature dependency in the conventional semiconductor integrated circuit. Typically, an oscillation frequency of the ring oscillation circuit is set to a high value in accordance with the worst temperature environment in which the circuit is used. Current consumption increases by wasteful current flowing by means of a high frequency oscillation even when the oscillation frequency could be lower. The present invention can suppress an increase of the current consumption caused by setting the oscillation frequency to be high.

The refresh circuit of the PSRAM circuit shown in FIG. 3 is described with reference to FIGS. 4–6.

Figure 4:
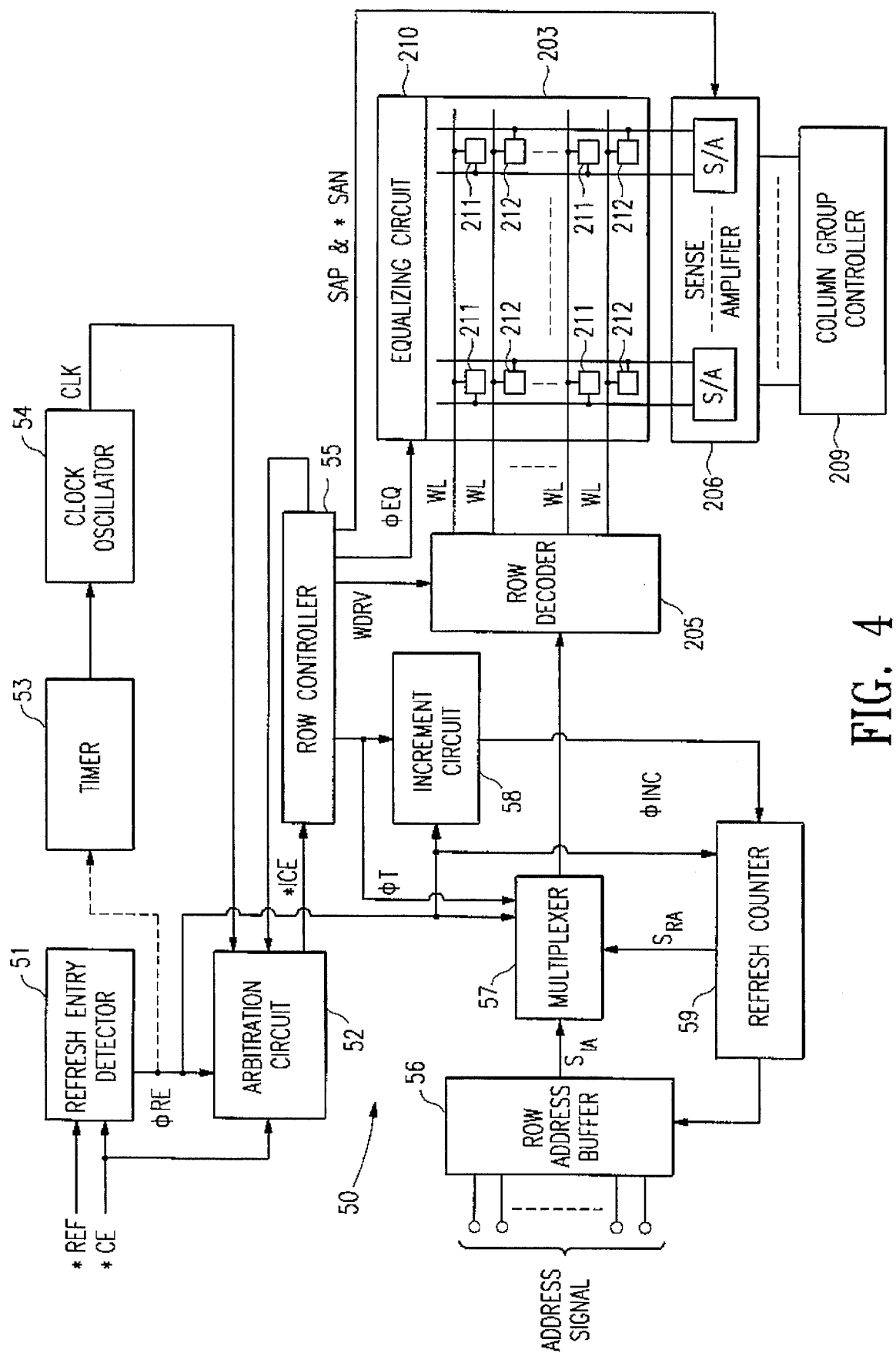
FIG. 4 is a block diagram showing a refresh circuit of the PSRAM circuit shown in FIG. 3.

The refresh circuit 50 shown in FIG. 4 comprises a refresh entry detector 51 for receiving a chip enable signal *CE and a refresh requirement signal *REF and for outputting a refresh entry signal ΦRE. An arbitration circuit 52 receives the chip enable signal *CE and the refresh entry signal ΦRE to arbitrate two signals in a refresh timing and for outputting an arbitration signal *ICE. Timer 53 counts a predetermined time. A clock oscillator 54 generates a predetermined clock CLK corresponding to an output of the timer 53 and for outputting the clock CLK to the arbitration circuit 52. Row controller 55 outputs various kinds of signals ΦT, WDRV, ΦEQ, SAP and *SAN so as to control writing, reading and refresh of data in a row direction. Row address buffer 56 outputs a row deciding signal $S_{IA}$ on the basis of a plurality of address signals so as to control a decision of address in the row direction. Multiplexer 57 receives each of signals *RE, $S_{IA}$, $S_{RA}$ and the like to select any of these signals corresponding to the timing signal ΦT supplied from the row controller 55 so as to output a selected signal to the row decoder 205. An increment circuit 58 outputs an increment signal ΦINC on the basis of the signals ΦRE and ΦT. Refresh counter 59 is incremented by the increment signal ΦINC and the refresh entry signal ΦRE and counts the address of the word lines being sequentially refreshed. Memory cell array 203 is connected to a column group controller 209 for controlling the sense amplifier 206. The memory cell array 203 is also connected to sense amplifier 206, which activates each pair of a plurality of bit line pairs, and to an equalizing circuit 210 for equalizing bit lines. The array 203 further comprises a plurality of memory cells 211 and dummy cells 212 which are arranged in a matrix shape, respectively.

Figure 5:
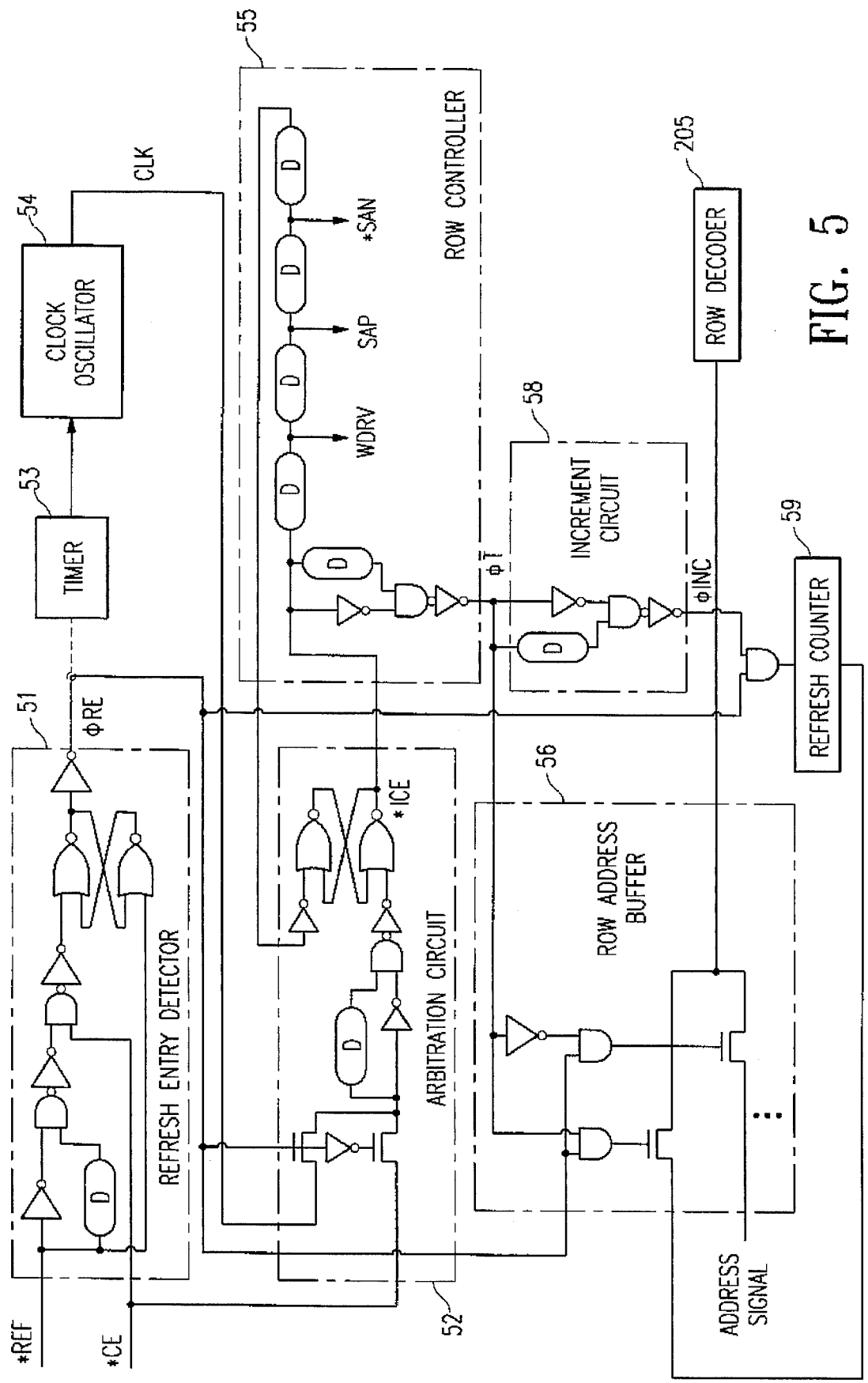
FIG. 5 is a circuit diagram showing a detailed configuration of each of the circuits shown in FIG. 4.
Figure 6:
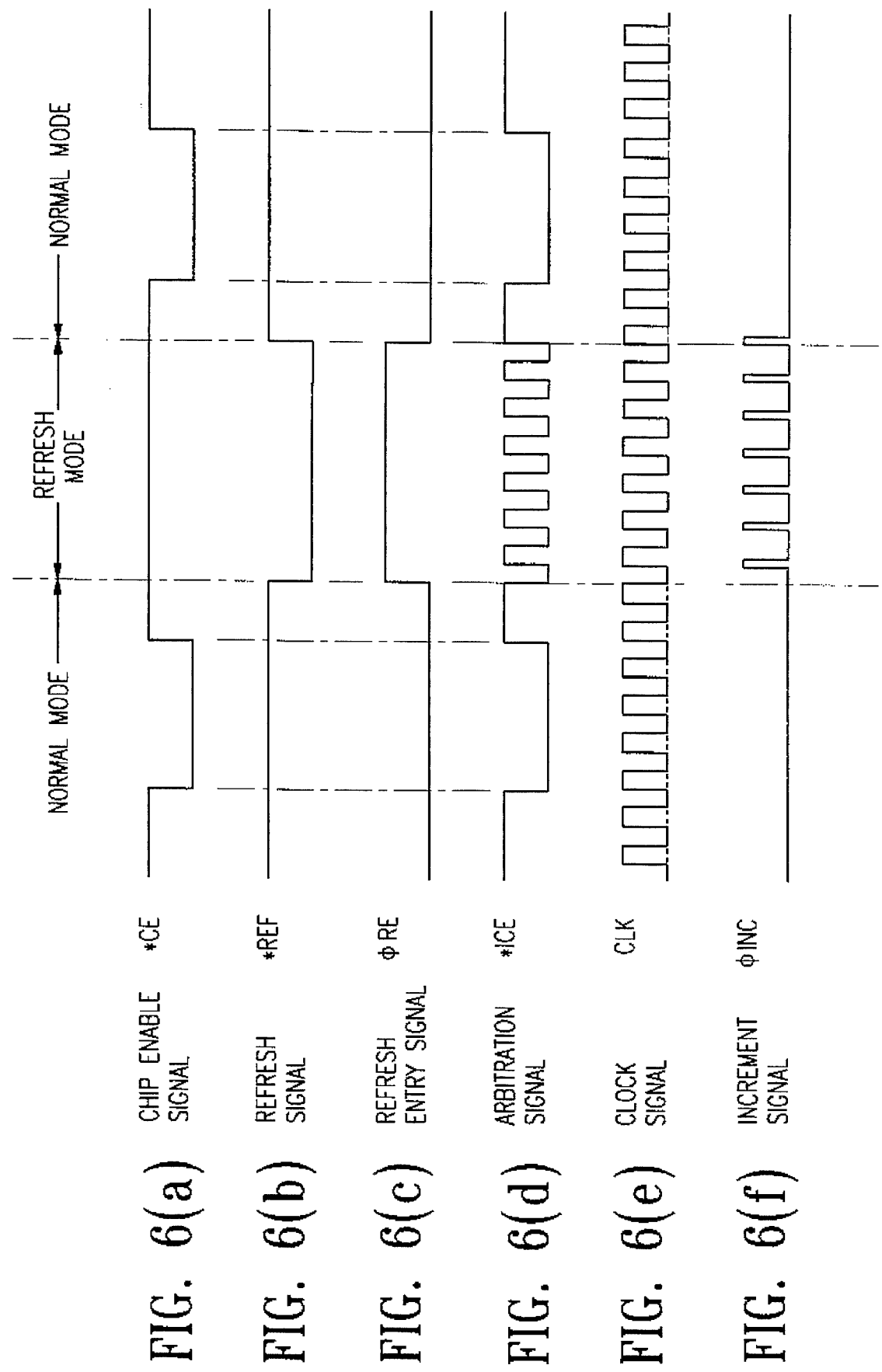
FIG. 6 is a timing chart showing waveforms of output signals from each of the circuits shown in FIGS. 3 and 4.

FIG. 5 shows in detail the circuitry of refresh circuit 50. The refresh circuit 50 operates at each of timings of the several signals having waveforms shown in FIG. 6. In FIG. 6, a refresh period is defined when the chip enable signal *CE is "H" and the refresh signal *REF is "L", and a normal period for performing a write and a read of normal data is defined as times other than the refresh period.

First, operation during the normal period is described. When the chip enable signal *CE falls, internal operation starts. Since the refresh entry signal ΦRE is "L" at this time, the arbitration signal *ICE synchronizes with the chip enable signal *CE. In other words, an internal operation under the condition of "*CE=*ICE" is performed in the manner that an external address signal is taken on the basis of the chip enable signal *CE, and data writing and reading are performed in accordance with the external address signal. Concretely, the sense amplifier 206 is activated when word line WL is driven in response to a rising word line driving signal WDRV outputted from the row controller 55, a raising signal SAP and a falling signal *SAN, both supplied from the row controller 55.

Next, there is described operation during the refresh period for preserving data stored in the memory. As shown in FIG. 6(a), the fall of refresh signal *REF starts the refresh period when the chip enable signal *CE is "H". During refresh, the refresh entry detector 51 compares the chip enable signal *CE with the refresh signal *REF (FIG. 6(b)) for a detection, and outputs the detection result as the refresh entry signal ΦRE shown in FIG. 6(c). The refresh entry signal ΦRE is supplied to the arbitration circuit 52, and the arbitration circuit 52 selects the clock signal CLK supplied from the clock oscillator and does not select the chip enable signal *CE so as to output to the row controller 55 the arbitration signal *ICE having a waveform synchronous with the clock signal CLK. The address issued from the row address buffer 56 is taken from the refresh counter 59 on the basis of the arbitration signal *ICE and the refresh entry signal ΦRE, thereby sequentially performing refresh of each cell according to the selected address. Word line WL is driven by raising the word line driving signal WDRV, and the signal SAP rises and the signal *SAN falls within row controller 55, thereby activating the sense amplifier 206. This operation is repeated during the refresh period when the refresh entry signal ΦRE is "H".

On the other hand, the refresh counter 59 is increased by the increment signal ΦINC supplied from the increment circuit 58. When the refresh signal *REF shown in FIG. 6(b) rises, the refresh entry signal ΦRE becomes "L", thereby ending the refresh period and beginning the normal period when the arbitration circuit 52 issues the arbitration signal *ICE in response to the chip enable signal *CE.

Figure 7:
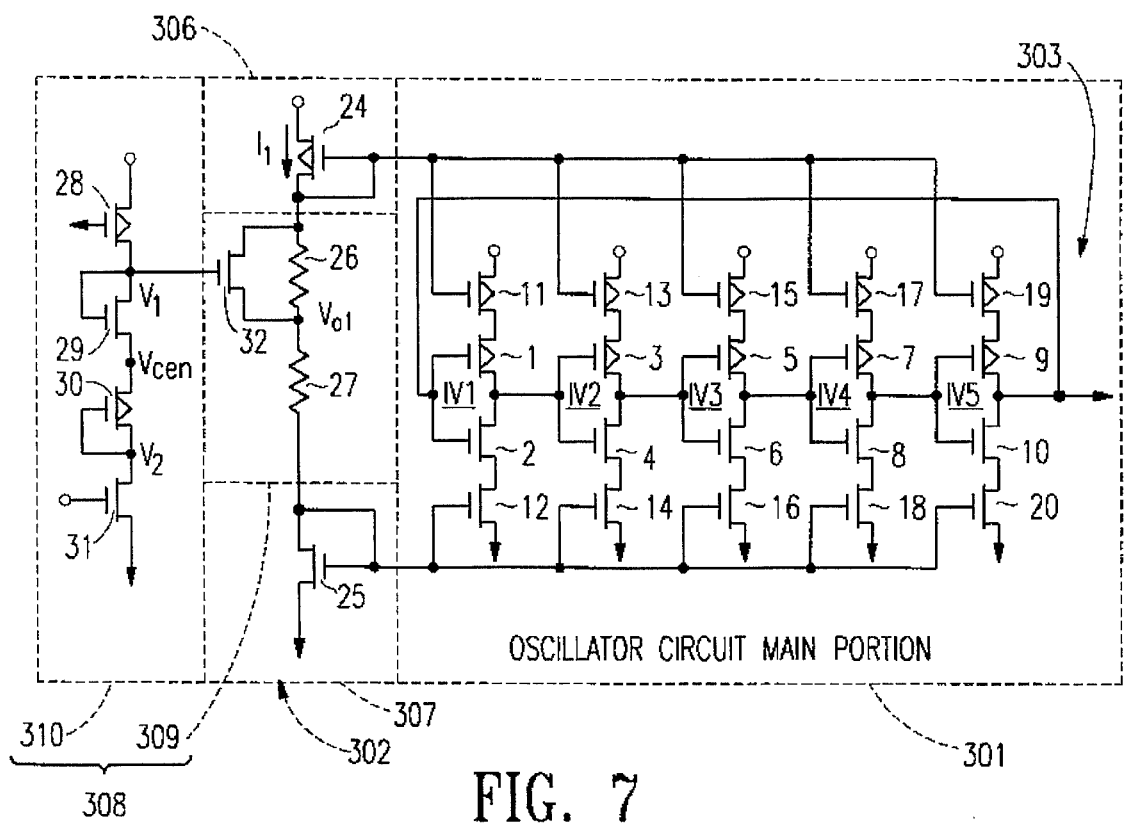
FIG. 7 is a circuit diagram showing a detailed configuration of the first embodiment when the ring oscillation circuit shown in FIG. 3 having a $V_{CC}$ depending characteristic is made from MOS transistors.

FIG. 7 shows a concrete configuration of the circuit shown in FIG. 3 is embodied as a metal oxide semiconductor (MOS) circuit having a $V_{CC}$ depending characteristic. Since the oscillation circuit main portion 301 has the same configuration as that shown in FIG. 1, the description thereof is here omitted, and only the bias control circuit 302 is described here.

In FIG. 7, the higher potential side bias voltage output circuit 306 comprises a PMOS transistor 24 in which a gate and a source are short-circuited, the lower potential side bias voltage output circuit 307 comprises an NMOS transistor 25 in which a gate and a source are short-circuited, and the gate potentials of transistors 24 and 25 become the gate potentials of the bias transistors 11–20 corresponding to the higher and lower potential sides.

The bias voltage regulation circuit 308 schematically comprises the variable resistor circuit 309 and the control voltage generation circuit 310.

The variable resistor circuit 309 comprises passive resistor elements 26 and 27 connected 1.5 in series with each other, and an NMOS transistor 32 having a drain connected to a higher potential end of the resistor element 26 and a source connected to a lower potential end of the resistor element 26. The conduction of the transistor 32 changes a resistance value between both ends of a serial circuit of the resistor elements 26 and 27 (hereafter, called as a passive resistor circuit). In other words, a resistance of the resistor element 26 decreases with an increase of the current flowing in the transistor 32, thereby decreasing a resistance value of the passive resistor circuit. In contrast, a resistance of the resistor element 26 increases with the decrease of the current flowing in the transistor 32, thereby increasing the resistance value of the passive resistor circuit. The larger the resistance value of the passive resistor circuit, the higher the voltage dividing ratio of the power source voltage $V_{CC}$ against the transistors 24 and 25. In other words, the correlative voltage dividing ratio of the transistors 24 and 25 decreases as the resistance value of the passive resistor circuit increases with increases in the power source voltage $V_{CC}$. It is therefore possible to suppress the increase of potential between a gate and a source of each of the bias transistors 11–20 and the oscillation frequency of the ring oscillation circuit 303 that would otherwise result from the increase of the power source voltage $V_{CC}$.

Therefore, the control voltage generation circuit 310 controls gate potential in the manner that the gate-source voltage $V_{GS}$ of the transistor 32 decreases with the increase of the power source voltage $V_{CC}$. Control voltage generation circuit 310 comprises PMOS transistors 28 and 30 and NMOS transistors 29 and 31. These transistors 28–31 are connected in series between the power source and ground, and are arranged in order from the higher potential side as transistor 28, transistor 29, transistor 30 and transistor 31. Predetermined voltages are added to the gates of transistors 28 and 31, the gate and source of each of the transistors 29 and 30 are short-circuited, and an intermediate potential of the power source voltage is provided at the current path interconnection node. The gate of transistor 32 receives the potential of a junction point between the source of transistor 28 and the drain of transistor 29.

Figure 10:
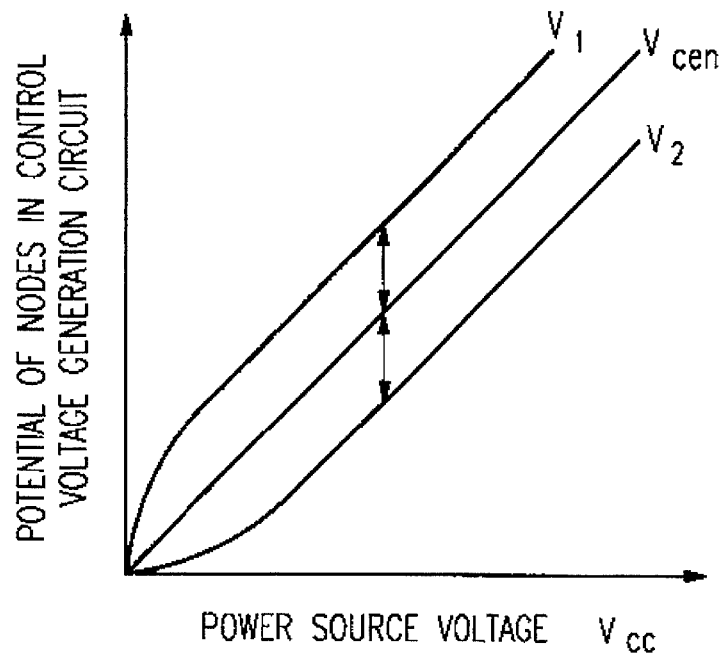
FIG. 10 is a characteristic diagram showing a relationship between the power source voltage ($V_{CC}$) and an output voltage of a control voltage generation circuit.
Figure 11:
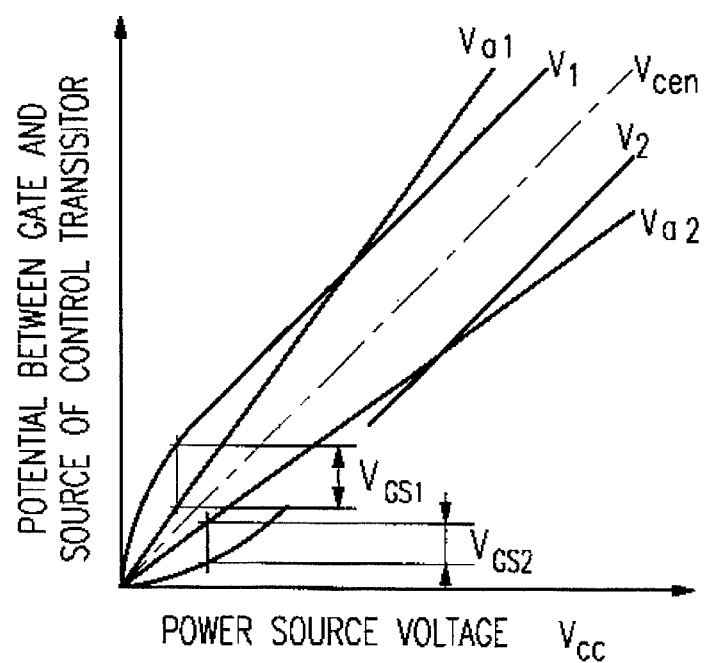
FIG. 11 is a characteristic diagram showing a relationship between the power source voltage ($V_{CC}$) and an output of the control voltage generation circuit ($V_{GS}$ of a variable control transistor)

FIG. 10 shows a relationship between the power source voltage $V_{CC}$ and an output voltage of the control voltage generation circuit 310, and FIG. 11 shows a relationship between the power source voltage and $V_{GS}$ of the transistor 32. A dimension of resistor elements 26 and 27, a ratio of a gate-width and a channel-length (W/L) and the like of the transistors 28–32 are determined to obtain the characteristic shown in FIGS. 10 and 11.

In other words, an example of W/L of the transistors 28–31 is first set as shown in the following: W/L of the transistors 28 and 31 is 3/1000, and W/L of the transistors 29 and 30 is 10/2. By this construction, a potential $V_{cen}$ of a connection node of sources of the transistors 29 and 30 increases linearly with increasing power source voltage $V_{CC}$. A drain potential $V_1$ of the transistor 29 sharply increases first non-linearly away from a slope of $V_{cen}$ near "0", and then increases with the same slope as $V_{cen}$. Furthermore, the drain potential $V_2$ of the transistor 30 increases first non-linearly more gently than the slope of $V_{cen}$ near "0" of the power source voltage $V_{CC}$, and then increases with the same slope as $V_{cen}$.

In FIG. 11, symbol $V_{a1}$ denotes a voltage corresponding to a source potential of the transistor 32, $V_{GS1}$ corresponds to "$V_1-V_{a1}$", and the following characteristics are illustrated. As $V_1$ changes from a sharp slope near the power source voltage "$V_{CC}=0$" to a gentler slope (the same as $V_{cen}$), $V_{GS1}$ turns transistor 32 on for values of $V_{CC}$ from 0 to a border voltage $V_{CCb}$. When $V_{CC}$ is greater than the border voltage $V_{CCb}$, $V_{GS1}$ becomes negative and $V_{GS1}$ does not keep transistor 32 turned on. While transistor 32 is turned on, a current becomes larger for small values of $V_{CC}$, thereby decreasing the resistance value. Since a current of the transistor 24 decreases as more current passes through the resistor element 26, a resistance of the resistor element decreases so as to reduce the resistance value of the entire resistor circuit. On the contrary, for higher values of $V_{CC}$ while transistor 32 is turned on, the resistance value of transistor 32 increases and a current flowing in the resistor element 26 becomes larger with an increase of $V_{CC}$, and a resistance value of the entire passive resistor circuit increases. A dimension of the transistor 32 and resistors 26 and 27 are set to obtain the above characteristics.

With the above characteristics, the resistance value of the passive resistor circuit decreases when the power source voltage $V_{CC}$ becomes low, and the resistance value of the passive resistor circuit increases when the power source voltage $V_{CC}$ becomes high, thereby suppressing the increase of the bias voltage of the bias transistor 11–20 in the ring oscillation circuit 303 caused by a change (especially an increase) of the power source voltage $V_{CC}$ so that it is possible to suppress the increase of the oscillation frequency of the ring oscillation circuit 303 according to the increase of the power source voltage $V_{CC}$.

Figure 12:
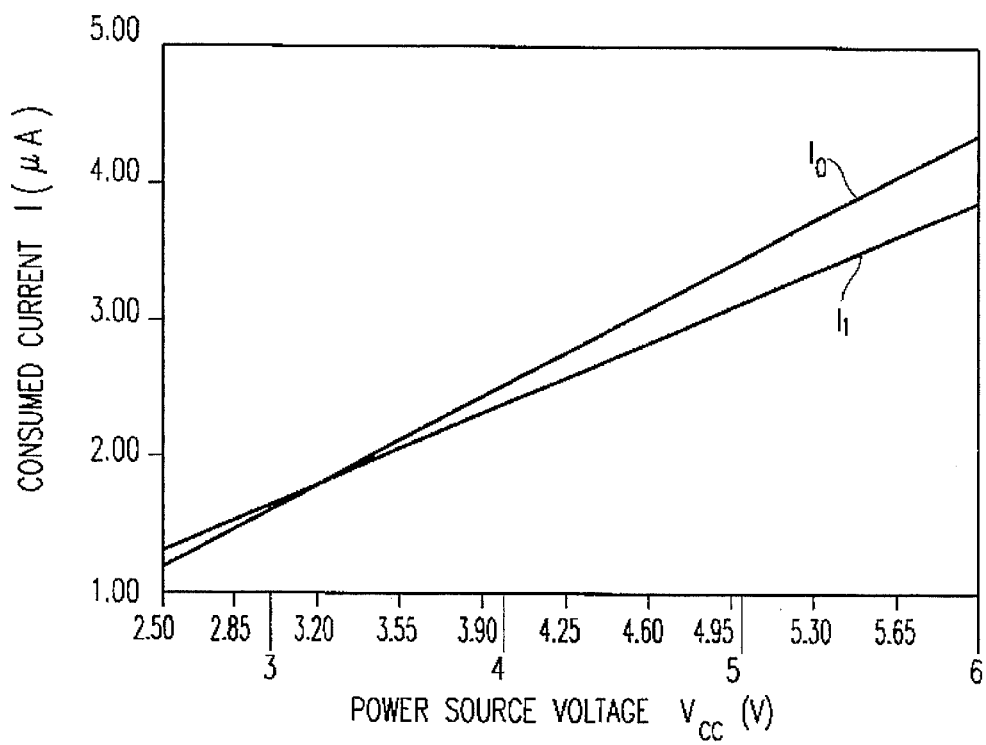
FIG. 12 is a characteristic diagram showing experimentally determined current consumption in an oscillation circuit main portion for an increase of $V_{CC}$ for the circuits of the present invention and the prior art.

In this connection, FIG. 12 shows a result of an experiment for comparing the increase of the $I_0$ and $I_1$ with an increase of the power source voltage $V_{CC}$ between a circuit of the present invention shown in FIG. 7 and the conventional circuit shown in FIG. 1. The current consumption of the respective ring oscillators is substantially proportional to this result.

As shown in FIG. 12, suppressing an increase of the oscillation frequency in the ring oscillation circuit in response to an increase of the power source voltage $V_{CC}$ can decrease current consumption where the voltage $V_{CC}$ is large. Here, $I_0$ is a current flowing in the transistor 21 of the conventional circuit, and the $I_1$ is a current flowing in the transistor 24 of the present invention.

It is clear that an application of the circuit of the present invention to the refresh circuit system of the PSRAM shown in FIG. 3 can decrease current consumption.

Figure 8:
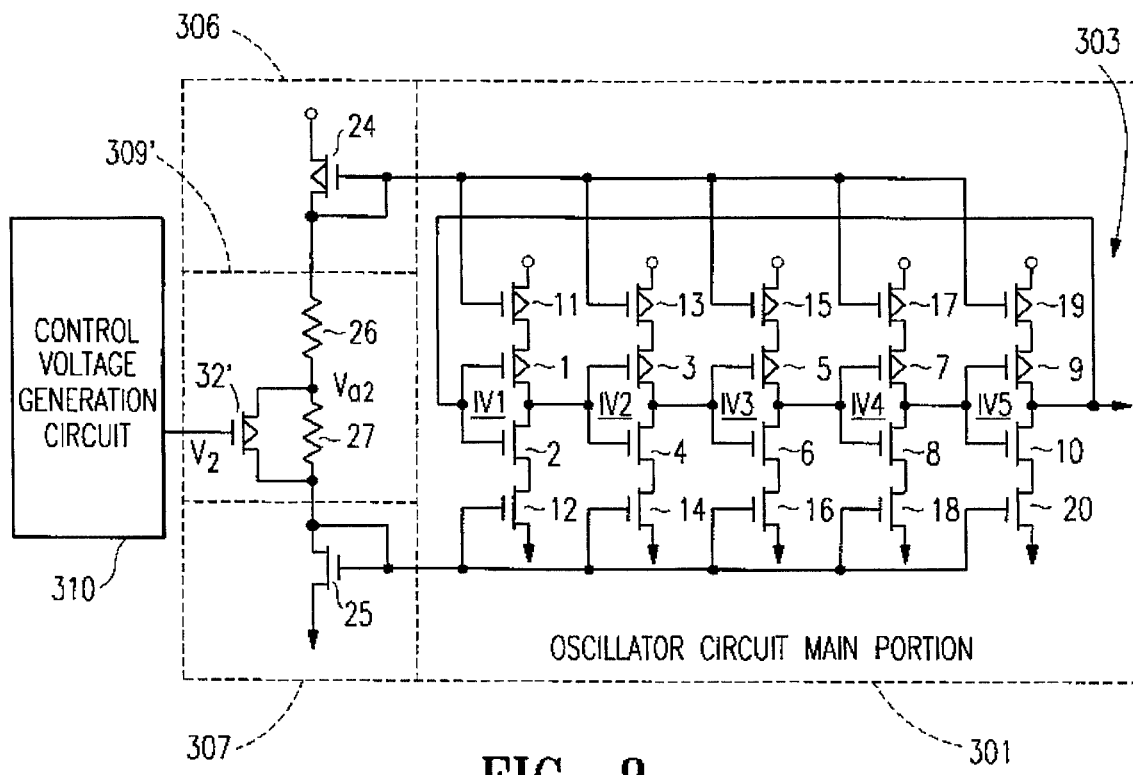
FIG. 8 is a circuit diagram showing a second embodiment of a variable resistor circuit for utilizing a power source voltage ($V_{CC}$) depending characteristic.

FIG. 8 shows a second embodiment of a variable resistor circuit having a $V_{CC}$ depending characteristic.

A variable resistor circuit 309' shown in FIG. 8 comprises PMOS transistor 32' in place of the NMOS transistor 32 in the variable resistor circuit 309 shown in FIG. 7. A gate of PMOS transistor 32' is connected to an output of $V_2$ of the intermediate potential generation circuit 310 and a source and drain are connected across resistor element 27.

Referring now to FIG. 11, $V_2$ is a voltage corresponding to a source potential of transistor 32', and $V_{GS2}$ corresponds to "$V_{a2} - V_2$". In the FIG. 11 circuit, $V_2$ changes from a gentle slope near the voltage $V_{CC}=0$ to a sharper slope (the same as $V_{cen}$). $V_{GS2}$ turns on transistor 32' while $V_{CC}$ varies from 0 to the border voltage $V_{CCb}$. When $V_{CC}$ becomes greater than the border voltage $V_{CCb}$, $V_{GS2}$ becomes negative and transistor 32' is not turned on. While transistor 32' is turned on, a current becomes larger for small values of $V_{CC}$, and the resistance value becomes small. Since the current of the transistor 24 becomes small through the resistor element 27, the resistance of the resistor element 27 becomes small, thereby decreasing the resistance value of the entire passive resistor circuit. On the contrary, while transistor 32' is turned on, the larger the voltage $V_{CC}$ is, the higher the resistance value of the transistor 32' is, thereby increasing a current flowing in the resistor element 27, and increasing the resistance value of the entire passive resistor circuit. A dimension is set to obtain the above characteristics of the transistor 32' and the resistor elements 26 and 27.

With the above characteristics, it is possible to suppress an increase of the potential differences between the gates and sources of the bias transistors 11–20 in the ring oscillation circuit 303 caused by changing conditions, especially the increase of the power source voltage $V_{CC}$, thereby resulting in the same function and effect as the circuit shown in FIG. 7 for suppressing the oscillation frequency of the ring oscillation circuit in accordance with the increase of the power source voltage $V_{CC}$.

Figure 9:
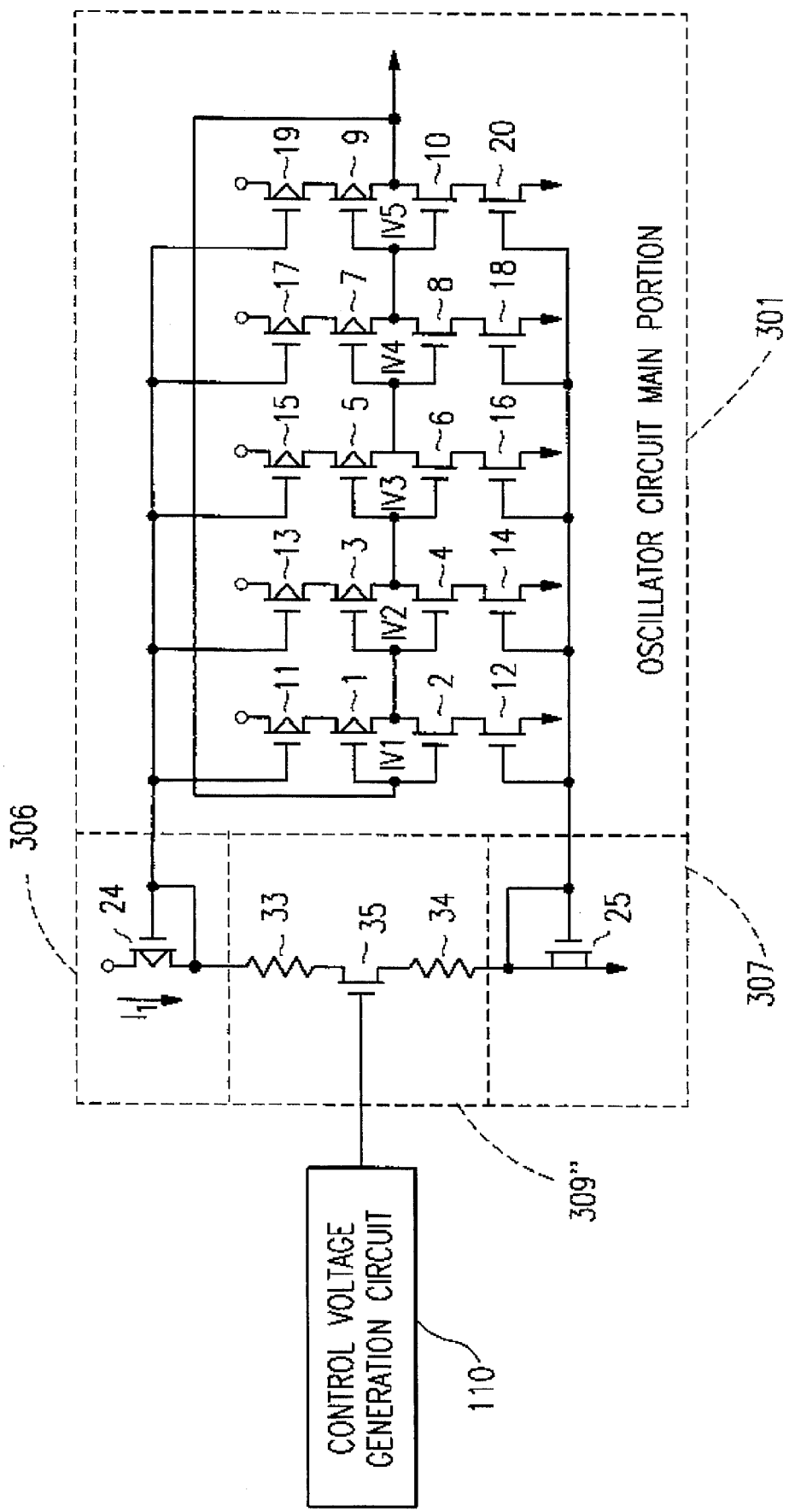
FIG. 9 is a circuit diagram showing a third embodiment of the variable resistor circuit for utilizing a power voltage ($V_{CC}$) depending characteristic.

FIG. 9 shows a third embodiment of the variable resistor circuit having a power source $V_{CC}$ depending characteristic.

A variable resistor circuit 309'' shown in FIG. 9 comprises two resistor elements 33 and 34 connected in series with each other and an NMOS transistor 35 connected in series with the resistor elements 33 and 34. An output voltage of the control voltage generation circuit 310 is supplied to the gate of the transistor 35 so as to control transistor 35 so that current flow decreases with the increase of the power source voltage $V_{CC}$. In this case, the transistor 35 is different from that shown in FIG. 7 and controlled not to be in a completely non-conductive condition, so that the resistance value thereof suppresses a current flowing in the transistor 24.

Figure 13:
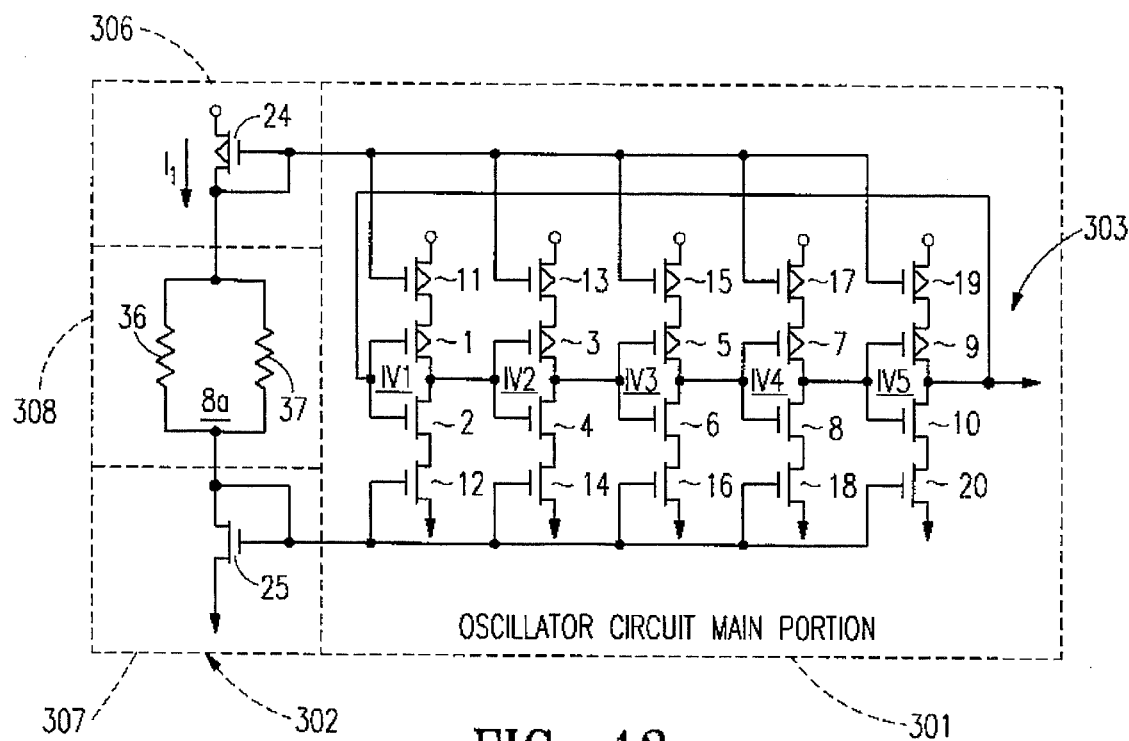
FIG. 13 a circuit diagram of a fourth embodiment in the case where the ring oscillation circuit shown an FIG. 3 is configured by MOS transistors having a temperature depending characteristic.

Next, before there is explained a circuit in the case where the circuit shown in FIG. 3 is constructed in the manner of having a temperature characteristic as shown in FIG. 13, an operation characteristic of an oscillation circuit main portion 301 and a bias control circuit 302 in this figure (which are the same portions as shown in FIG. 7 and FIG. 1) is further investigated with no consideration for the temperature characteristic.

At first, since the transistors 24 and 25 operate in a pentode region, a current $I_1$ flowing in the transistor 24 is obtained by $$I_1 = \beta 24 (V_{GS24} - V_{TP24})^2 / 2 \tag{5}$$

Furthermore, for transistors 11, 13, 15, 17 and 19, a current $I_{D5}$ flowing in the transistor operating in the pentode region is obtained by $$I_{D5} = \beta (V_{GS24} - V_{TP})^2 / 2 \tag{6}$$

Taking $V_{TP24}$"$V_{TP}$, equation (6) is subtracted by an equation (5) to obtain $$I_{D5} = (\beta/\beta 24) \cdot I_1 \tag{7}$$

and it is understood that $I_{D5}$ is proportional to $I_1$. In short, $I_{D5}$ and $I_1$ are in relationship of a current mirror.

Next, for transistors 11, 13, 15, 17 and 19, a current $I_{D3}$ flowing in the transistor operating in the pentode region is obtained by $$I_{D3} = \beta\{(V_{GS24} - V_{TP})V_{DS} - V_{DS}^2/2\} \tag{8}$$

Accordingly, for $V_{TP24}$"$V_{TP}$, equation (8) is subtracted by the equation (5) so as to obtain $$I_{D3} = \{(\beta/\beta 24) V_{DS}(V_{DS24} - V_{TP}) - V_{DS}^2/\{2(V_{GS24} - V_{TP})^2\}I_1 \tag{9}$$

Here, $V_{GS24}$ and $V_{TP}$ are constant. Accordingly, $I_{D3}$ is determined by $V_{DS}$ and I24, and it is understood that $I_{D3}$ is in proportion with $I_{24}$.

Above operation is the same as the relationship between the transistor 25 and transistors 12, 14, 16, 18 and 20. Accordingly, it can be said that a current flowing in the transistor 25 is proportional to the current flowing in the current path formed by the transistors 1–20 in the ring oscillation circuit 303. At this time, if an oscillation frequency f of the ring oscillation circuit 303 is proportional to a current of the circuit 301, the oscillation frequency f is proportional to the current $I_1$ of bias control circuit 302. The oscillation cycle $T_G$ of the oscillation circuit 303 is obtained by $$T_G = 1/f = k/I_1 \tag{10}$$

When this is represented as a function of the resistance R in the bias control circuit 302, the following is obtained:

$$T_G = cR + d \tag{11}$$

it can be understood that the cycle proportionally increases against the resistance R in the bias control circuit 302.

Figure 14:
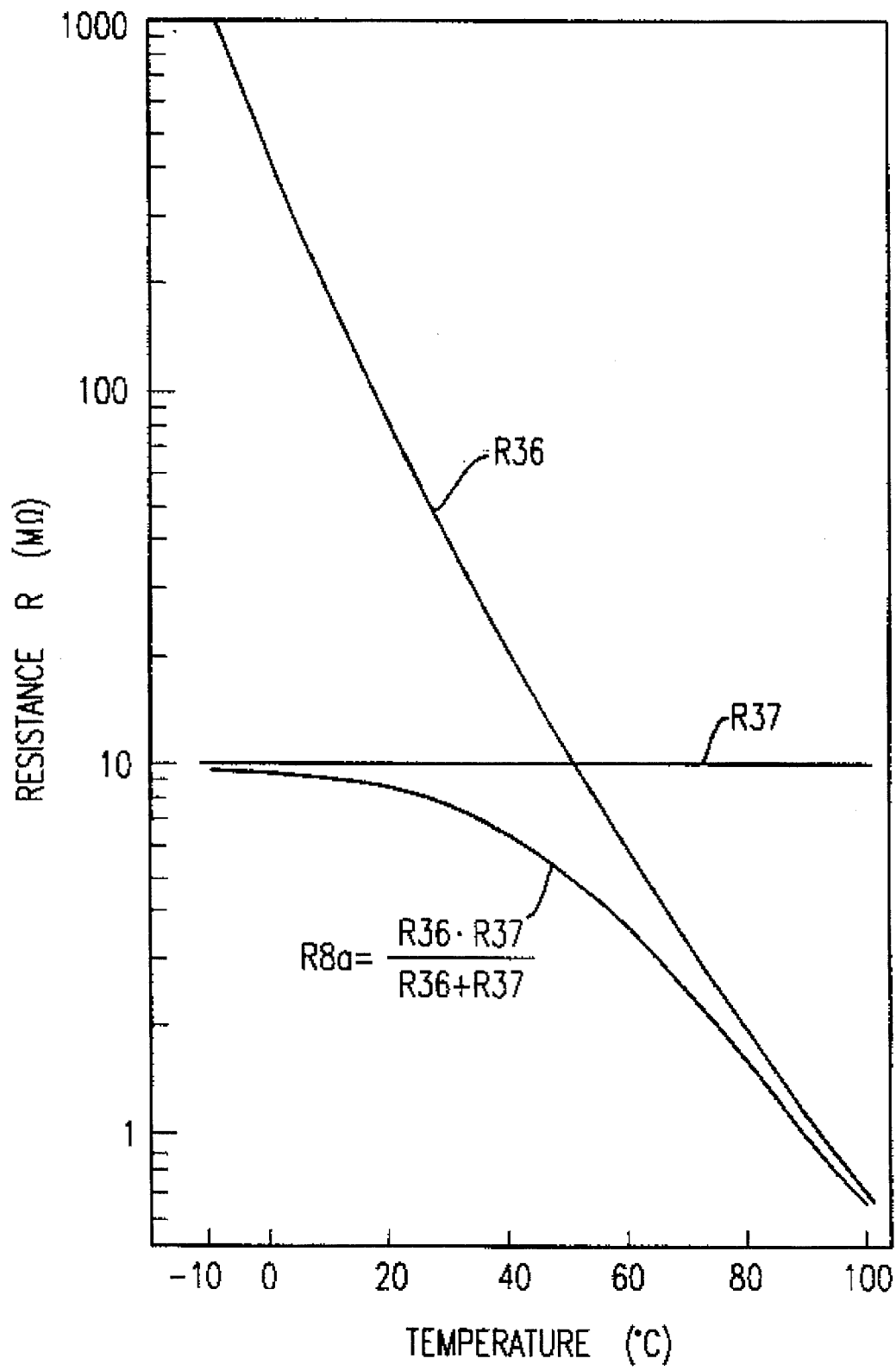
FIG. 14 is a characteristic diagram showing temperature characteristics of a single resistor and a composite resistor each constituting a resistor element of a temperature depending variable resistor circuit shown in FIG. 13.

In FIG. 13, a control voltage generation circuit 308 constitutes a portion of the bias control circuit 302 and comprises a parallel circuit comprised of a passive resistor element 36 and a passive resistor element 37. The resistor element 36 has a temperature characteristic in which a resistance value decreases with an increase of temperature as shown by curve R36 in FIG. 14, while the resistor element 37 has a temperature characteristic in which a resistance value is constant (about 10 MΩ) even when the temperature changes, as shown by a curve R37 in FIG. 14. Since the resistor elements 36 and 37 are connected in parallel with each other, a composite resistance characteristic is shown by a curve R8a.

Accordingly, since the resistor elements 36 and 37 each having the different temperature characteristic are connected in parallel with each other, the temperature characteristic of the resistor is regulated as follows:

Since the resistance value of the resistor element 37 does not change with the temperature changes, even though the resistance value of the resistor element 36 having the temperature characteristic increases greatly at low temperatures, the resistor element 37 can supply a current, thereby placing an upper limit on the resistance between the nodes nd81 and nd82 to the resistance of the resistor element 37.

In the case of using the conventional resistor element having little temperature characteristic, even though a cycle of the oscillation circuit 301 is almost constant with respect to temperature, use of a resistor element having a sufficient temperature characteristic can change an oscillation cycle of the ring oscillation circuit 303 for different temperatures.

Accordingly, it is extremely efficient to use this circuit in a refresh timer provided for a memory having a necessity of refresh operation, for example.

Figure 19:
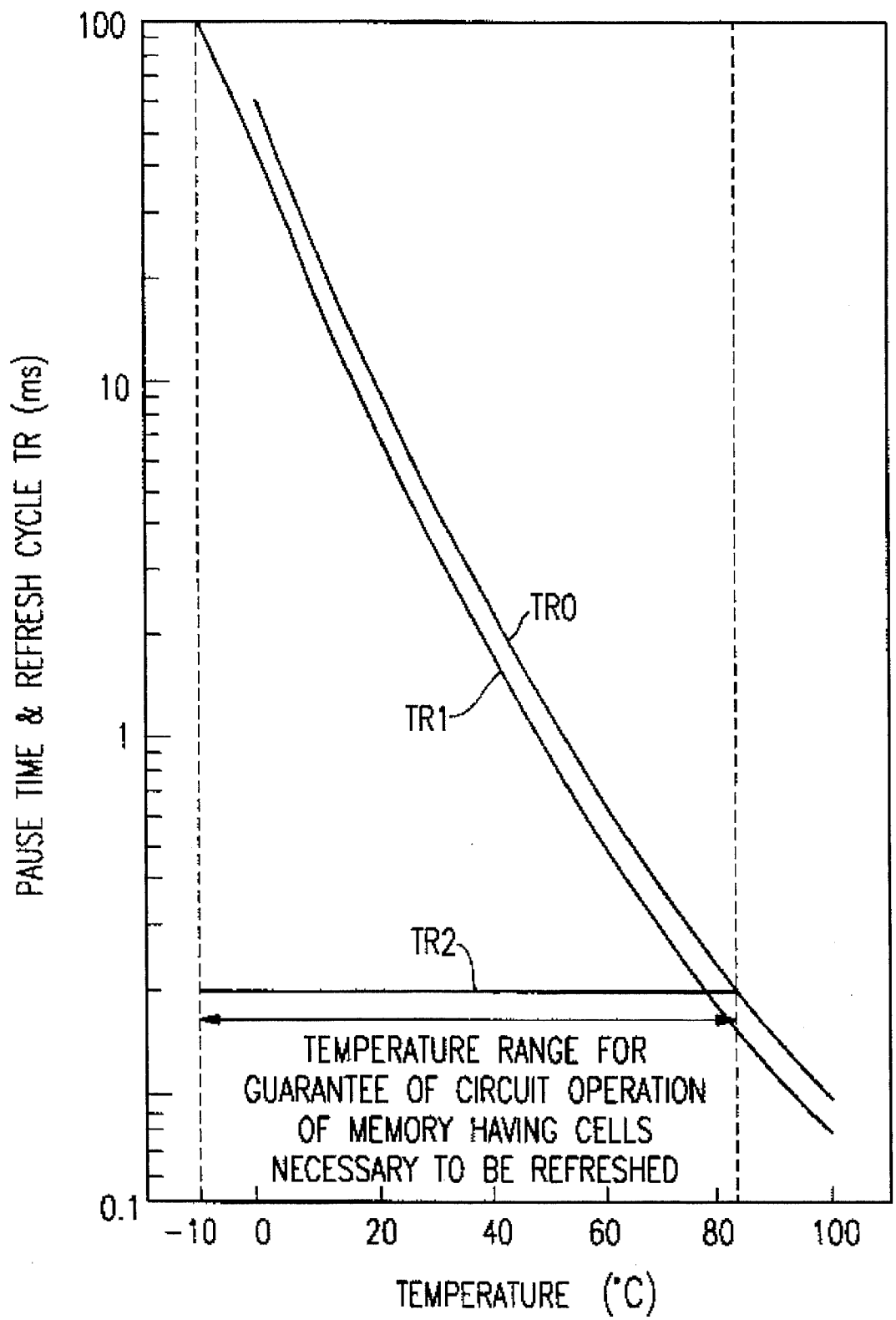
FIG. 19 are characteristic diagrams showing the worst pause characteristic ($T_{RO}$) of a refresh cycle necessary to a security of circuit operation of a PSRAM, a temperature characteristic ($T_{R1}$) of a refresh cycle in the case where a conventional ring oscillation circuit including a resistance element single body having a temperature depending characteristic is used to set a refresh cycle of the PSRAM and a temperature characteristic ($TR_2$) of a refresh cycle in the case where a conventional ring oscillation circuit is used to set a refresh cycle of the PSRAM.

Here, FIG. 19 respectively shows the worst pause characteristic ($T_{R0}$) as a temperature characteristic of the refresh cycle necessary to ensure circuit operation of the PSRAM, a temperature characteristic ($T_{R1}$) of the refresh cycle in the case where there is used the ring oscillation circuit 303 having a resistor element 36 which replaces resistor element 23 shown in FIG. 1 to set a refresh cycle of the PSRAM, and a temperature characteristic ($T_{R2}$) of the refresh cycle in the case where there is used the conventional ring oscillation circuit 101 shown in FIG. 1 to set a refresh cycle of the PSRAM.

As shown in FIG. 19, since the conventional refresh cycle does not change with the temperature against the worst pause characteristic $T_{R0}$ of the PSRAM, the refresh cycle is set shorter than the worst pause time of the cells under any temperature condition as shown by the symbol $T_{R2}$, thereby resulting in current consumption over the necessary amount with decreasing temperature.

On the contrary, if the resistor element 23 shown in FIG. 1 is replaced by the resistor element 36, it is possible to change the refresh cycle in a shape approximated to the worst pause characteristic corresponding to the temperature as shown by the symbol $T_{R2}$.

However, when the single resistor element 36 is used (namely, when there is not used the parallel circuit with the resistor element 37), the following problems may occur:

At first, judging from the curve $T_{R1}$ shown in FIG. 19, when the temperature becomes low, the bias current of the ring oscillation circuit becomes extremely low.

Figure 20:
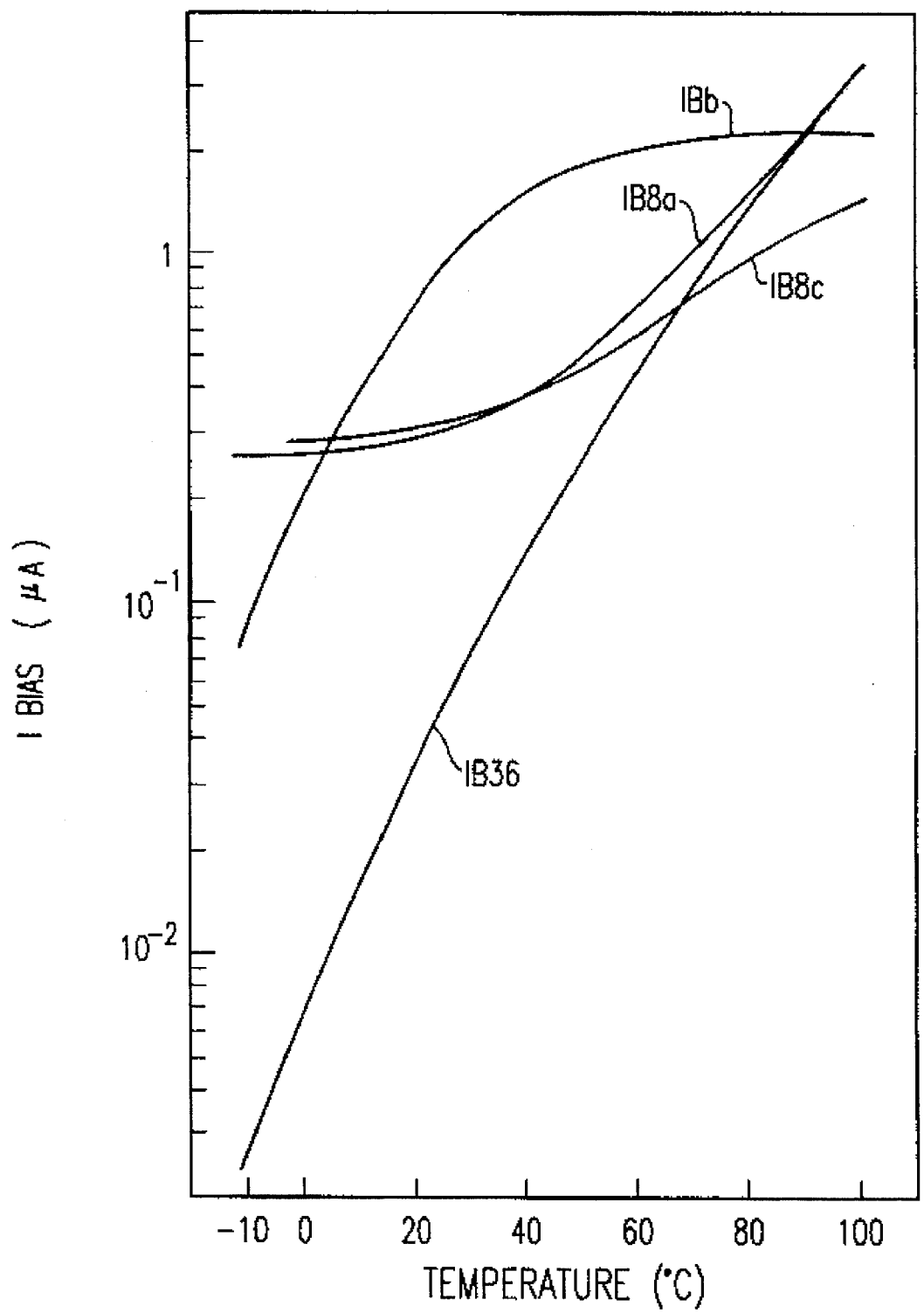
FIG. 20 is a characteristic diagram showing a temperature characteristic of a bias current in the case where a single temperature depending resistor element is used, and in the case a composite resistor circuit is used, respectively.

FIG. 20 respectively shows temperature characteristics of a bias current (IB36) in the case where the single resistor element 36 is used, a bias current (IB8a) in the case where the composite resistor circuit 8a shown in FIG. 13 is used, and bias currents (IB8b and IB8c) in the case where composite resistor circuits 8b and 8c each shown in FIG. 15 and FIG. 17 which are mentioned later are used, respectively.

As shown by the curve of the symbol IB36, the current is lower near the noise level in a predetermined temperature range, and it is uncertain whether or not circuit operation is normal in the temperature range. When resistor element 36 is not used by itself and is used in combination with the resistor element 37 in a parallel connection to form a circuit 8a, the upper limit of the resistance value is limited to the resistance value of the resistor element 37. Thus, a bias current of the ring oscillation circuit may be kept above a fixed value in any temperature range as shown by a symbol IB8a, so that the oscillation frequency of the ring oscillation circuit 303 does not increase over the fixed value.

Returning to FIG. 19, the worst pause characteristic shown by the curve $T_{R0}$ has a predetermined distribution in relation to the temperature. Therefore, when the worst pause characteristic approximates the refresh cycle characteristic shown by the curve $T_{R1}$ in the case where the single resistor element 36 is used, it is necessary to inspect the operation temperature in the entire range when a pause inspection is performed during a manufacture of a memory. Furthermore, when a slope of the curve $T_{R1}$ is steeper than a slope of the curve $T_{R0}$, since the worst condition in which the refresh cycle approximates to the pause time resides on a low temperature side, a pause inspection at this time is performed on the low temperature side, thereby resulting in a time necessary to one pause inspection two figures longer than the inspection on the high temperature range.

On the contrary, for the variable resistor circuit 8a in FIG. 13, since the oscillation cycle of the ring oscillation circuit 303 is gentle on the high temperature side and the worst condition resides also on the high temperature side, the pause inspection is performed only on the high temperature side. In addition, the pause inspection on the high temperature side can be performed by a time shorter than that on the low temperature side. By this, it is possible to perform the pause inspection in a short time, thereby shortening the time for design and reducing the cost of production.

Figure 15:
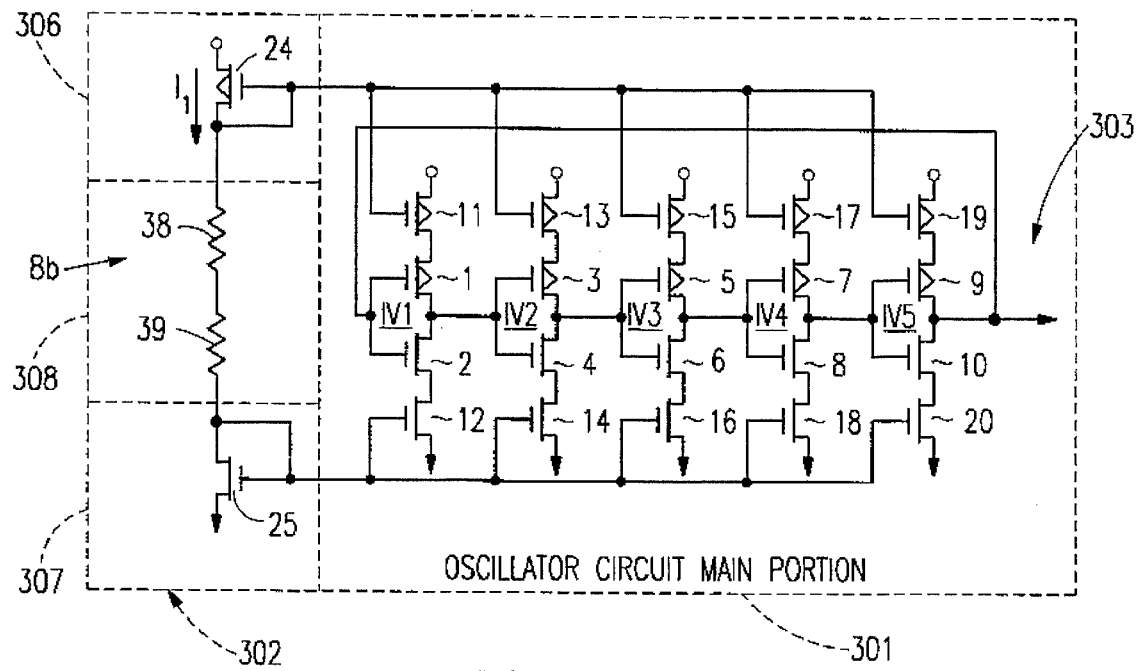
FIG. 15 is a circuit diagram showing a circuit of a fifth embodiment different from the circuit shown m FIG. 13 in the case where the ring oscillation circuit shown in FIG. 3 is configured from MOS transistors having a temperature depending characteristic.
Figure 16:
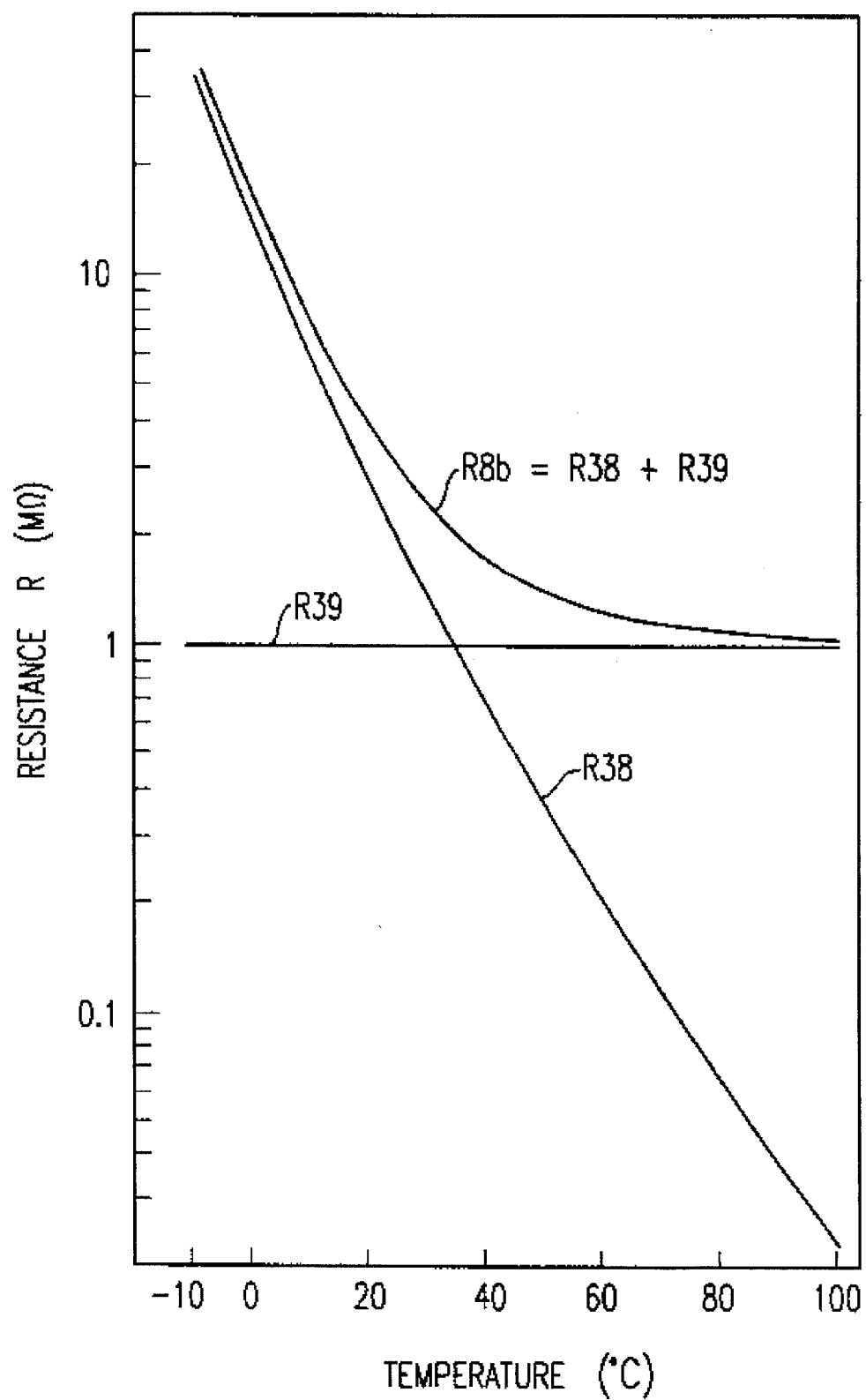
FIG. 16 is a characteristic diagram showing temperature characteristics of a single resistor and a composite resistor each constituting a resistor element of a temperature depending variable resistor circuit shown in FIG. 15.

A variable resistor circuit 8b shown in FIG. 15 comprises a passive resistor element 38 and a passive resistor element 39, and FIG. 16 shows a temperature characteristic of each resistor element and of the combination circuit. The resistor element 38 has a temperature characteristic in which the resistance value becomes low for high temperatures, as shown by a curve R38 in FIG. 16, and the resistor element 39 has a temperature characteristic in which the resistance value is constant (about 1 MΩ) with respect to temperature changes as shown by a curve R39 in FIG. 16. Since the resistor elements 38 and 39 are connected in series with each other, a composite resistance characteristic is shown by a curve R8b in FIG. 16.

In other words, since the resistor elements 38 and 39 each having the different temperature characteristics are connected in series with each other, because the resistance value of the resistor element 39 does not change with the temperature change, even though the resistance value of the resistor element 38 having the temperature depending characteristic decreases with the increase of the temperature to a small value, the composite resistance value does not decrease under the resistance value of the component effect of the resistor element 39.

By this, as shown by a curve IB8b in FIG. 20, the bias current of the ring oscillation circuit 103 is limited to or less than the fixed value in any temperature range.

Accordingly, it is possible to prevent unnecessary current consumption over any temperature range. At this time, the oscillation cycle of the ring oscillation circuit 303 does not become less than the predetermined value.

Figure 17:
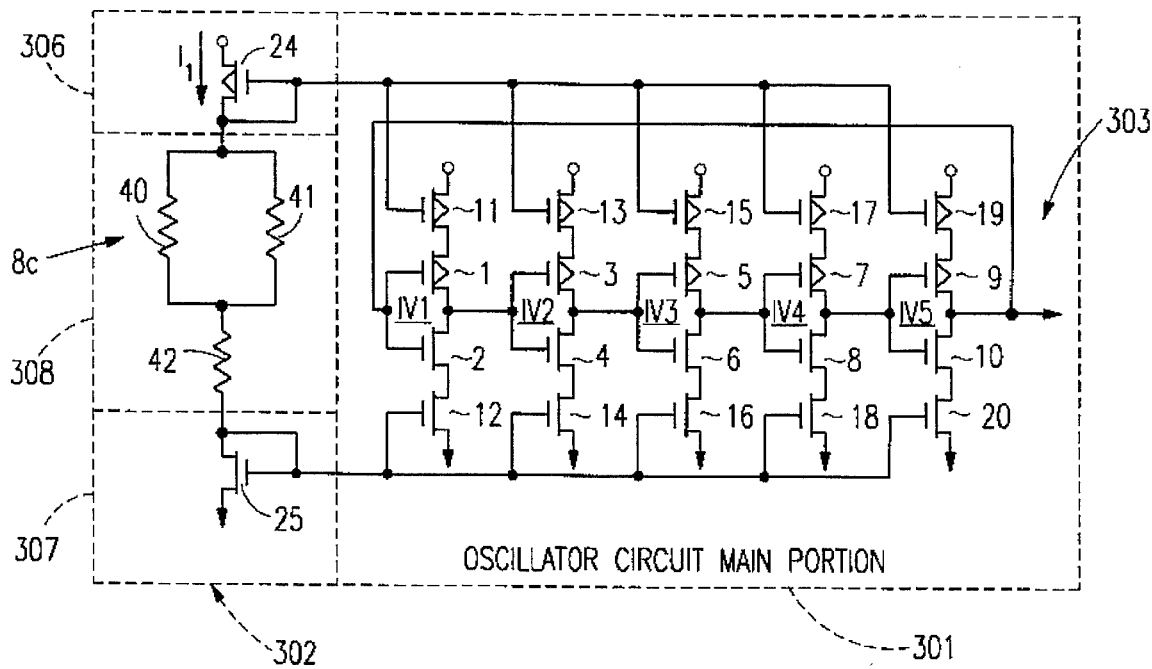
FIG. 17 is a circuit diagram showing a circuit of a sixth embodiment different from the circuit shown in FIGS. 13 and 15 in the case where the ring oscillation circuit shown in FIG. 3 is configured from MOS transistors having a temperature depending characteristic.
Figure 18:
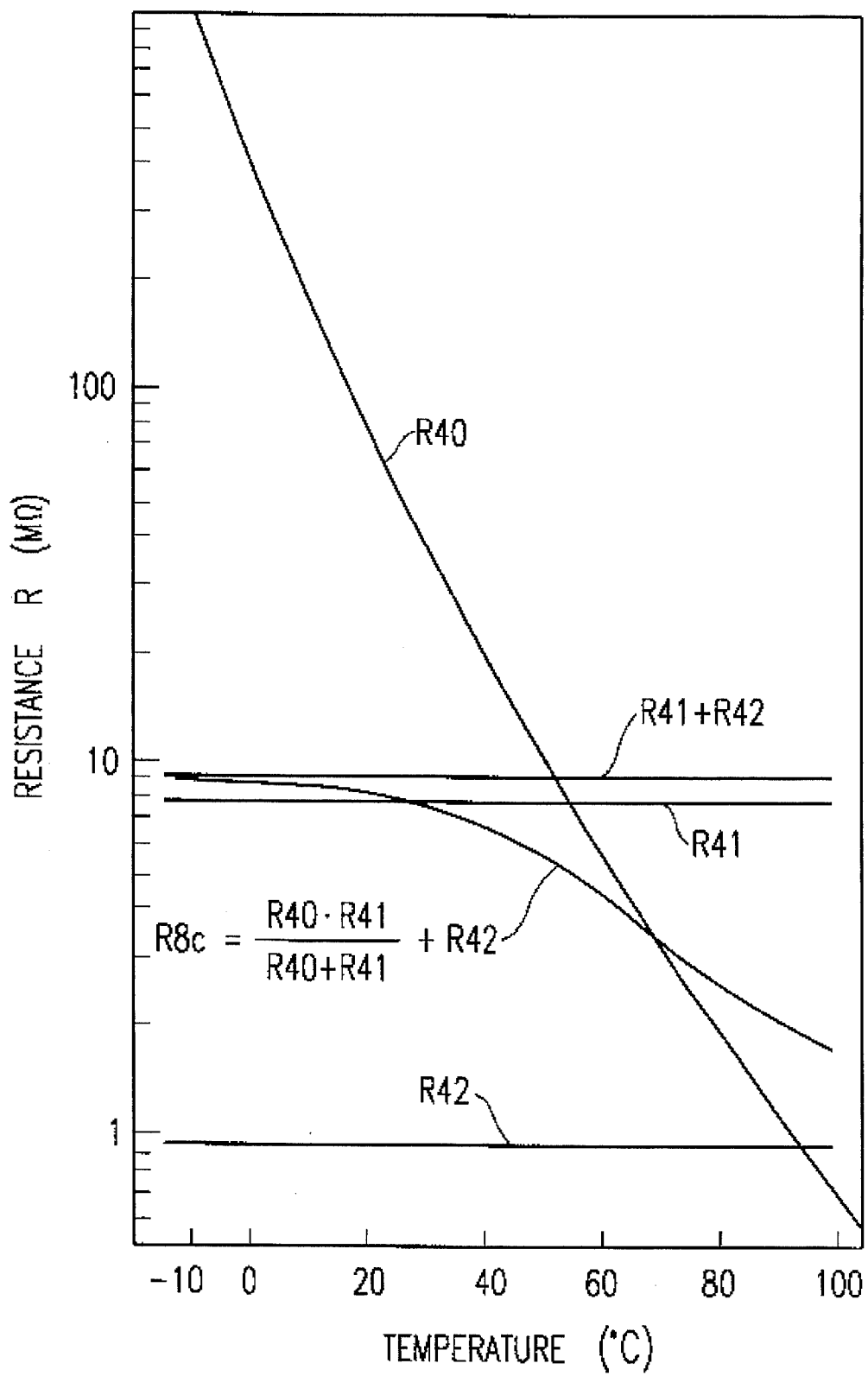
FIG. 18 is a characteristic diagram showing temperature characteristics of a single resistor and a composite resistor each constituting a resistor element of a temperature depending variable resistor circuit shown in FIG. 17.

The variable resistor circuit 8c shown in FIG. 17 corresponds to a combination of the variable resistor circuits 8a and 8b, and comprises three passive resistor elements 40–42. The resistor elements 40 and 41 are connected in parallel to form a parallel circuit connected in series with the resistor element 42. FIG. 18 shows a temperature characteristic of each of the resistor elements and of the combination circuit. The resistor element 40 has a temperature characteristic in which the resistance value decreases for high temperatures as shown in a curve R40 in FIG. 18 and corresponds to the resistor element 36 (or 38), the resistor element 41 has a temperature characteristic in which the resistance value is constant (about 10 MΩ) with respect to temperature as shown by a curve R41, and the resistor element 42 has a temperature characteristic in which the resistance value is constant (about 1 MΩ) with respect to temperature as shown by a curve R42. In the case where there is a combination of the serial circuit and parallel circuit of the resistor elements 40–42, a composite resistance value changes with a temperature as shown by a curve R8c shown in FIG. 18, thereby limiting the circuit resistance in accordance with the upper limit resistance of resistor element 41 and a lower limit resistance of resistor element 42.

Since the variable resistor circuit 8c has both of the characteristics of the variable resistor circuits 8a and 8b, a bias current of the ring oscillation circuit 303 is limited within a specified range in any temperature range as shown by a curve IB8c in FIG. 20, thereby limiting also an oscillation cycle of the ring oscillation circuit 303 to a value within a specified range.

A resistor element incorporating the resistor elements 36, 38 and 40 having the above temperature characteristics, can be provided with, for example, a high-R resistor which is well known as a static random access memory (SRAM), namely, a polysilicon resistor which is used in a high-resistance polysilicon load type E/R cell.

FIGS. 21A and 21B show a manufacturing process of the resistor elements.

At first, in FIG. 21A, a gate oxide layer 142 is formed on an element region of a silicon substrate 141, and an element separation oxide layer 143 is formed on a separation region between elements. Furthermore, a polysilicon layer 144 (e.g., a gate wiring material) is formed on a region from the gate oxide 142 to the element separation oxide layer 143. A portion of the polysilicon layer 144 on the oxide layer 143 is formed as a high-R resistor. In other words, a mask 145 comprising an insulation layer or a resist layer is formed on the portion becoming the high-R resistor, and an impurity ion 146 is implanted into the polysilicon layer 144 left exposed by the mask. As shown in FIG. 21B, the polysilicon layer 144 is separated into a conductive portion 147 which is substantially a conductor, and a high-R resistor portion 148 which is substantially an insulator because the impurity ion 146 is not implanted thereinto, so that a connection between the gate electrode and the temperature characteristic resistor element comprised of the high-R resistor is performed in a self-coordination. After that, an interlayer oxide layer 149 is formed, and a contact hole is opened so as to form a connection with other element region and the like by an electrode 14A.

By the way, even though ring oscillation circuit 303 in the above-mentioned embodiment has any of the constructions of the variable resistor circuit having a power source depending characteristic and the variable resistor circuit having a temperature depending characteristic, the present invention can combine both of the circuits having respective characteristics.

For example, FIG. 22 shows a circuit configuration in the case where the variable resistor circuit 309 shown in FIG. 7 and the temperature depending variable resistor circuit 8c shown in FIG. 17 are combined with each other. In this case, the transistor 32 is connected in series between the resistor element 40 and the junction point on the higher side between the resistor elements 40 and 41 in the variable resistor circuit 8c, and has both of the characteristics of the power source dependency of the variable resistor circuit 309 and the temperature dependency of the resistor circuit 8c.

In other words, the larger the current flows in the transistor 32, the smaller the resistance value of the resistor element 40, thereby decreasing the resistance value of the passive resistor circuit. On the contrary, the smaller the current flows in the transistor 32, the larger the resistance value becomes, thereby increasing the resistance value of the passive resistor circuit. Since the voltage dividing ratio of the power source voltage $V_{CC}$ increases against the bias transistors 24 and 25 with increasing resistance value of the passive resistor circuit, or conversely, since the voltage dividing ratio of the transistors 24 and 25 correlatively decreases, if the voltage $V_1$ causes the resistance value of the passive resistor circuit to be increased with increasing the power source voltage $V_{CC}$, it is possible to suppress an increase of a gate potential of the bias transistors 11–20 and an oscillation frequency of the ring oscillation circuit 303 with increasing the power source voltage $V_{CC}$.

Furthermore, the bias current of the ring oscillation circuit 303 is limited to a value within a specified range over any temperature range as shown by a curve IB8c in FIG. 20, thereby limiting an oscillation frequency of the ring oscillation circuit 303 to a value within a predetermined range.

Accordingly, by this embodiment, it is possible to properly change the bias voltage of the ring oscillation circuit corresponding to both conditions of the power source voltage $V_{CC}$ and the temperature.

Even though all of the temperature depending variable resistor circuits according to the above-mentioned embodiments are formed from the combination of the passive resistor elements, a part or entire of the resistor circuit may be constituted by constant voltage diodes to use the temperature characteristic of the diodes.

Figure 23:
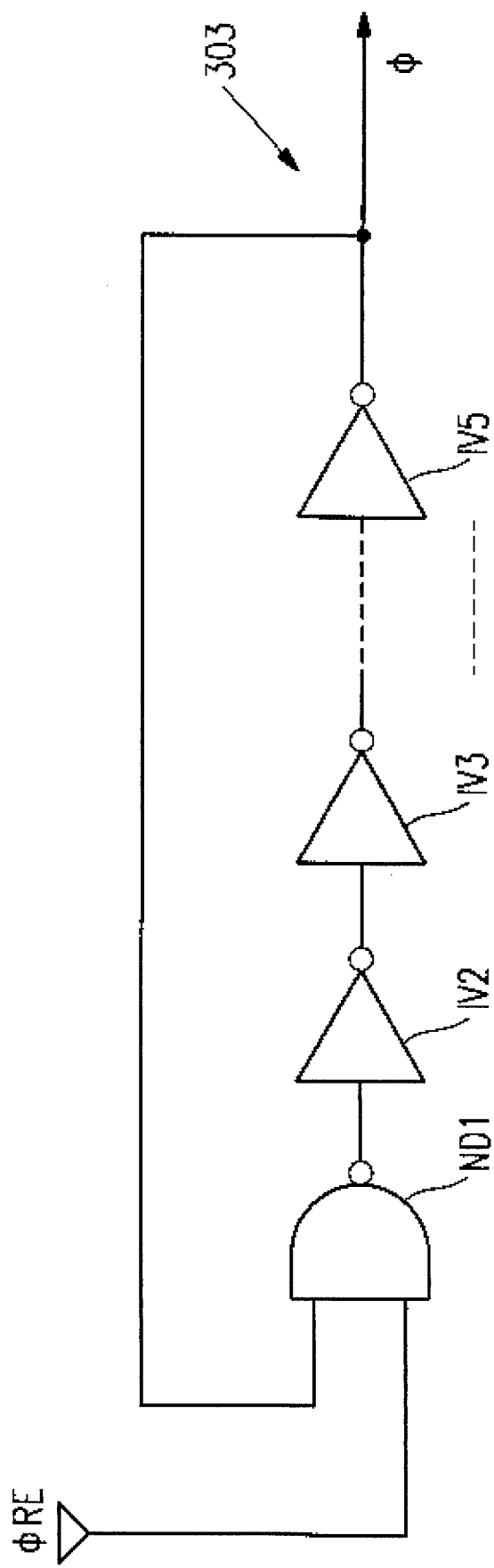
FIG. 23 is a logic circuit diagram showing a semiconductor integrated circuit according to an eighth embodiment in which a different configuration is provided for a ring oscillation circuit.

Furthermore, even though all of the ring oscillation circuits in the first through seventh embodiments are comprised of the odd-numbered inverters, the present invention is not limited in such the constitution, and may be constructed from an eighth embodiment shown in FIG. 23, in which NAND circuit ND1 is provided in place of the first stage inverter and even-numbered inverters IV2–IV5 are provided from the second stage to final stage. One input of the NAND circuit ND 1 is a refresh entry signal ΦRE, and the other input of the NAND circuit ND1 is an output Φ of the ring oscillation circuit 303.

Figure 24:
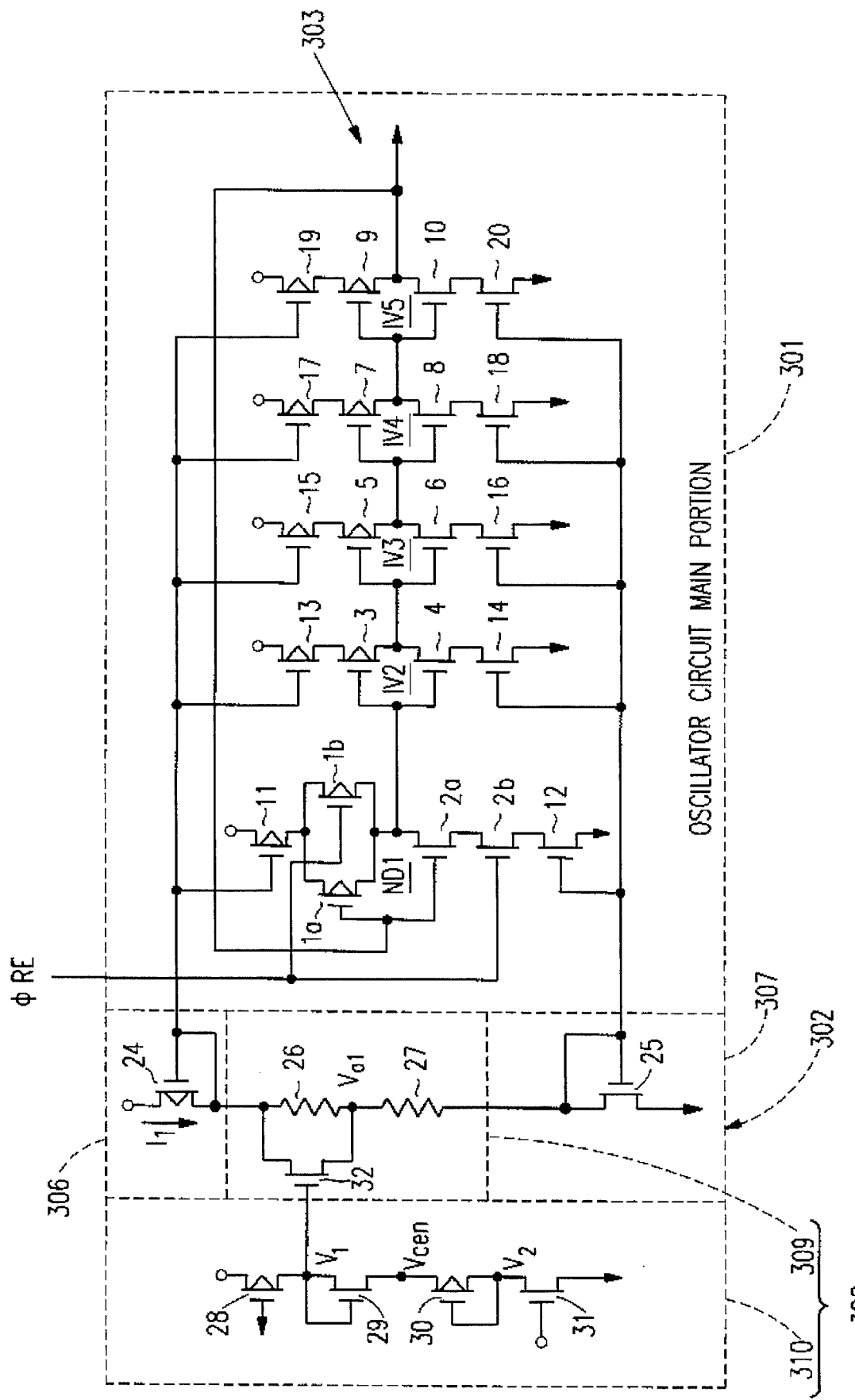
FIG. 24 is a circuit diagram showing a detailed configuration of a ring oscillation circuit shown in FIG. 23.

FIG. 24 shows a configuration of the eighth embodiment, in which since the configuration except the NAND circuit ND1 is the same as the concrete configuration of the first embodiment shown in FIG. 7, the duplicated description will be omitted. It is of course that possible ring oscillation circuits each using the NAND circuit ND1 corresponding to the second through seventh embodiments may be provided.

What is claimed is:

1. A semiconductor integrated circuit comprising:

a ring oscillation circuit having an odd-number of complimentary metal oxide semiconductor (CMOS) inverter circuits;

a high bias circuit on a higher potential side for biasing transistors on the higher potential side of said CMOS inverter circuits;

a low bias circuit on a lower potential side for biasing transistors on the lower potential side of said CMOS inverter circuits;

a high bias voltage output circuit on the higher potential side for issuing a bias voltage to said high bias circuit;

a low bias voltage output circuit on the lower potential side for issuing a bias voltage to said low bias circuit; and a bias voltage regulation circuit including a variable resistor circuit which changes a resistance value corresponding to a power source voltage and is inserted between said high bias voltage output circuit and said low bias voltage output circuit so as to form a voltage divider circuit with said high and low bias voltage output circuits for the power source voltage, thereby changing an output voltage of said high and low bias voltage output circuits, wherein said bias voltage regulation circuit comprises:

a power source dependent variable resistor circuit including passive resistor elements and a variable control transistor having a source and drain connected between an intermediate node of said passive resistor elements, for changing a resistance value between both sides thereof by a conductive condition of said variable control transistor; and a control voltage generation circuit for controlling a gate voltage of said variable control transistor in the manner that a voltage between a gate and said source of said variable control transistor decreases with an increase of said power source voltage.

2. The semiconductor integrated circuit according to claim 1, wherein said power source dependent variable resistor circuit comprises:

a plurality of said passive resistor elements connected in series with each other; and said variable control transistor having a drain connected to one end of one resistor element within said plurality of passive resistor elements, and a source connected to the other end of said one resistor element.

3. The semiconductor integrated circuit according to claim 1, wherein said power source dependent variable resistor circuit comprises:

a plurality of said passive resistor elements connected in series with each other; and said variable control transistor having the current path between drain and source connected between first and second resistor elements of said plurality of passive resistor elements.

4. The semiconductor integrated circuit according to claim 1, wherein said control voltage generation circuit comprises:

an intermediate potential generation circuit having a plurality of voltage divider control transistors in which current paths are connected in series with each other between a higher side power source and a lower side power source, and outputting an intermediate potential occurring at an inter-junction point of said current paths of said plurality of voltage divider control transistors for controlling the gate voltage of the variable control transistor by said intermediate potential of a power source voltage.

5. A semiconductor integrated circuit comprising:

a ring oscillation circuit having an odd-number of complimentary metal oxide semiconductor (CMOS) inverter circuits;

a high bias circuit on a higher potential side for biasing transistors on the higher potential side of said CMOS inverter circuits;

a low bias circuit on a lower potential side for biasing transistors on the lower potential side of said CMOS inverter circuits;

a high bias voltage output circuit on the higher potential side for issuing a bias voltage to said high bias circuit;

a low bias voltage output circuit on the lower potential side for issuing a bias voltage to said low bias circuit; and a bias voltage regulation circuit including a variable resistor circuit which changes a resistance value corresponding to a temperature and is inserted between said high bias voltage output circuit and said low bias voltage output circuit so as to form a voltage divider circuit with said high and low bias voltage output circuits for a power source voltage, thereby changing an output voltage of said high and low bias voltage output circuits, wherein a slope of a temperature characteristic in an oscillation cycle of the ring oscillation circuit is gentler than a slope of temperature characteristic of a pause time of a memory cell on a higher temperature side within a temperature range of operation of a memory including a dynamic type memory cell and refresh function portion.

6. The semiconductor integrated circuit according to claim 5, wherein said bias voltage regulation circuit comprises a temperature dependent variable resistor circuit comprised of a combination of a plurality of passive resistor elements having different temperature characteristics.

7. The semiconductor integrated circuit according to claim 6, wherein said temperature dependent variable resistor circuit comprises a temperature independent resistor element for keeping a predetermined resistance value against a temperature change; and a temperature dependent resistor element which is connected in parallel with said temperature independent resistor element and has a negative characteristic against said temperature change.

8. The semiconductor integrated circuit according to claim 5, wherein said temperature dependent variable resistor circuit comprises:

a temperature independent resistor element for keeping a predetermined resistance value against a temperature change; and a temperature dependent resistor element which is connected in series with said temperature independent resistor element and has a negative characteristic against said temperature change.

9. The semiconductor integrated circuit according to claim 5, wherein said temperature dependent resistor circuit comprises:

a temperature independent resistor element for keeping a predetermined resistance value against a temperature change, a first temperature dependent resistor element which is connected in parallel with said temperature independent resistor element and has a negative characteristic against said temperature change; and a second temperature dependent resistor element which is connected in series with said temperature independent resistor element and has a negative characteristic against said temperature change.

10. A semiconductor integrated circuit comprising:

a ring oscillation circuit having an odd-number of complimentary metal oxide semiconductor (CMOS) inverter circuits;

a high bias circuit on a higher potential side for biasing transistors on the higher potential side of said CMOS inverter circuits;

a low bias circuit on a lower potential side for biasing transistors on the lower potential side of said CMOS inverter circuits;

a high bias voltage output circuit on the higher potential side for issuing a bias voltage to said high bias circuit;

a low bias voltage output circuit on the lower potential side for issuing a bias voltage to said low bias circuit; and a bias voltage regulation circuit including a variable resistor circuit which changes a resistance value corresponding to a power source voltage and a temperature and is inserted between said high bias voltage output circuit and said low bias voltage output circuit so as to form a voltage divider circuit with said high and low bias voltage output circuits for the power source voltage, thereby changing an output voltage of said high and low bias voltage output circuits, wherein said bias voltage regulation circuit comprises:

a power source dependent variable resistor circuit including passive resistor elements having different temperature characteristics and a variable control transistor having a source and drain connected between an intermediate node of said passive resistor elements, for changing a resistance value between both sides thereof by a conductive condition of said variable control transistor; and a control voltage generation circuit for controlling a gate voltage of said variable control transistor in the manner that a voltage between a gate and said source of said variable control transistor decreases with an increase of said power source voltage, wherein a slope of a temperature characteristic in an oscillation cycle of the ring oscillation circuit is gentler than a slope of a temperature characteristic of a pause time of a memory cell on a higher temperature side within a temperature range of operation of a memory including a dynamic type memory cell and refresh function portion.

11. A semiconductor integrated circuit comprising:

a ring oscillation circuit having an odd-number of complimentary metal oxide semiconductor (CMOS) inverter circuits;

a high bias circuit on a higher potential side for biasing transistors on the higher potential side of said CMOS inverter circuits;

a low bias circuit on a lower potential side for biasing transistors on the lower potential side of said CMOS inverter circuits;

a high bias voltage output circuit on the higher potential side for issuing a bias voltage to said high bias circuit;

a low bias voltage output circuit on the lower potential side for issuing a bias voltage to said low bias circuit;

a bias voltage regulation circuit including a variable resistor circuit which changes a resistance value corresponding to a specified condition and is inserted between said high bias voltage output circuit and said low bias voltage output circuit so as to form a voltage divider circuit with said high and low bias voltage output circuits for the power source voltage, thereby changing an output voltage of said high and low bias voltage output circuits;

a counter circuit having a plurality of binary counters connected in series, the binary counters outputting pulse signals in response to output signals of the ring oscillation circuit;

a frequency dividing circuit, responsive to the pulse signals from the binary counters, for outputting pulse signals, each signal being outputted when an output value of the counter circuit reaches a predetermined value, thus dividing an output frequency of the ring oscillation circuit;

a dynamic type memory cell array having a plurality of memory cells arranged in a matrix shape; and a refresh function circuit, responsive to the output pulse signals of the frequency dividing circuit, for refreshing the memory cells at a cycle on the basis of the output frequency of the ring oscillation circuit.

12. A semiconductor integrated circuit according to claim 11, wherein the refresh function circuit comprises:

an address counter, responsive to each output pulse signal of the frequency dividing circuit, for increasing one address;

an address increment detector, responsive to the increased address, for outputting an address increment detection signal, the address counter starting a address counting operation in response to the address increment detection signal;

a row decoder storing address values which are increased in response to the increased address, wherein a word line connected to a specific number of the memory cells corresponding to the increased address value is turned on in response to the increased address; and a plurality of sense amplifiers each connected to a bit line pair connected to a specific number of the memory cells, each sense amplifier being activated in response to the address increment detection signal, as delayed by a predetermined period of time, so that a memory cell is chosen by the turned-on word line and the activated sense amplifier and is refreshed.

13. A semiconductor integrated circuit according to claim 12, wherein the refresh function circuit further comprises a controller, responsive to a control signal, for controlling the row decoder and the sense amplifiers for a refresh operation.

14. A semiconductor integrated circuit according to claim 13, wherein the refresh function circuit further comprises a detector for detecting a signal indicating that the refresh operation is in a predetermined refresh period and outputting the control signal synchronized with a clock signal, so that the row decoder and the sense amplifiers conduct the refresh operation.

15. A semiconductor integrated circuit according to claim 13, wherein the refresh function circuit further comprises a detector for detecting a signal identifying a normal operation of the semiconductor integrated circuit in a predetermined normal operation period and outputting the control signal synchronized with the signal identifying the normal operation signal, so that the row decoder and the sense amplifiers conduct the normal operation.

16. A semiconductor integrated circuit according to claim 12, wherein the refresh function circuit further comprises a counter, responsive to the increased address value, for counting addresses of the word lines sequentially turned on.

17. A semiconductor integrated circuit according to claim 11, wherein the dynamic type memory cell array further includes a plurality of dummy memory cells arranged in a matrix shape.

* * * * *